United States Patent
Ahn et al.

(10) Patent No.: US 10,263,035 B2
(45) Date of Patent: Apr. 16, 2019

(54) MAGNETORESISTIVE RANDOM ACCESS MEMORY DEVICES AND METHODS OF MANUFACTURING THE SAME

(71) Applicants: Sung-Min Ahn, Hwaseong-si (KR); Ji-Su Ryu, Hwaseong-si (KR); Seung-Min Lee, Hwaseong-si (KR)

(72) Inventors: Sung-Min Ahn, Hwaseong-si (KR); Ji-Su Ryu, Hwaseong-si (KR); Seung-Min Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 15/213,706

(22) Filed: Jul. 19, 2016

(65) Prior Publication Data
US 2017/0148848 A1   May 25, 2017

(30) Foreign Application Priority Data
Nov. 24, 2015   (KR) .................... 10-2015-0164501

(51) Int. Cl.
| H01L 43/08 | (2006.01) |
| H01L 27/22 | (2006.01) |
| H01L 43/02 | (2006.01) |
| H01L 43/10 | (2006.01) |

(52) U.S. Cl.
CPC ............ H01L 27/222 (2013.01); H01L 43/02 (2013.01); H01L 43/10 (2013.01)

(58) Field of Classification Search
CPC ..... H01L 27/222; H01L 27/224; H01L 43/12; H01L 43/14; H01L 43/08; G11C 11/161; G11C 2211/5615
See application file for complete search history.

(56) References Cited

U.S. PATENT DOCUMENTS

| 7,821,818 | B2 | 10/2010 | Dieny et al. | |
| 7,859,034 | B2 | 12/2010 | Huai et al. | |
| 8,153,188 | B2 | 4/2012 | Fukuzawa et al. | |
| 8,670,271 | B2 | 3/2014 | Zheng et al. | |
| 9,076,954 | B2 | 7/2015 | Khvalkovskiy et al. | |
| 2002/0141232 | A1* | 10/2002 | Saito ................... | G11C 11/16 365/158 |
| 2004/0094785 | A1* | 5/2004 | Zhu ..................... | G11C 11/16 257/295 |
| 2004/0188732 | A1* | 9/2004 | Fukuzumi ............ | B82Y 10/00 257/295 |
| 2012/0023386 | A1* | 1/2012 | Oh ....................... | H01L 43/08 714/769 |
| 2012/0244639 | A1* | 9/2012 | Ohsawa ............... | H01L 43/12 438/3 |

(Continued)

FOREIGN PATENT DOCUMENTS

| JP | 2006-237154 | 9/2006 |
| JP | 2008-210905 | 9/2008 |

*Primary Examiner* — Hoang-Quan T Ho
*Assistant Examiner* — John Lin
(74) *Attorney, Agent, or Firm* — Myers Bigel, P.A.

(57) ABSTRACT

An MRAM device includes a lower electrode on a substrate, an MTJ structure on the lower electrode, a metal oxide pattern on the MTJ structure, a conductive pattern on at least a portion of a sidewall of the metal oxide pattern, and an upper electrode on the metal oxide pattern and the conductive pattern. The conductive pattern has a thickness varying along the sidewall of the metal oxide pattern in a plan view.

20 Claims, 26 Drawing Sheets

(56) References Cited

U.S. PATENT DOCUMENTS

2015/0028440 A1   1/2015  Liu et al.
2015/0200003 A1   7/2015  Buhrman et al.
2016/0351238 A1*  12/2016 Doyle .................. G11C 11/161

* cited by examiner

1ST DIRECTION
⊗——— 2ND DIRECTION

1ST DIRECTION
⊗——— 2ND DIRECTION

1ST DIRECTION
⊗⟶ 2ND DIRECTION

MAGNETORESISTIVE RANDOM ACCESS MEMORY DEVICES AND METHODS OF MANUFACTURING THE SAME

CROSS-REFERENCE TO RELATED APPLICATION

This application claims priority under 35 USC § 119 to Korean Patent Application No. 10-2015-0164501, filed on Nov. 24, 2015 in the Korean Intellectual Property Office (KIPO), the contents of which are herein incorporated by reference in their entirety.

FIELD

Some embodiments relate to semiconductor devices and methods of manufacturing the same. More particularly, example embodiments relate to magnetoresistive random access memory (MRAM) devices and methods of manufacturing the same.

BACKGROUND

In an MRAM device including an MTJ structure, a switching current may be applied so as to switch the magnetization direction of a free layer in the MTJ structure. It may be important to reduce the density of the switching current so that the characteristics of the MTJ structure may be enhanced.

SUMMARY

Some embodiments provide methods of manufacturing an MRAM device having good characteristics.

Some embodiments provide MRAM devices having good characteristics.

According to some embodiments, there is provided an MRAM device. The MRAM device may include a lower electrode on a substrate, an MTJ structure on the lower electrode, a metal oxide pattern on the MTJ structure, a conductive pattern on at least a portion of a sidewall of the metal oxide pattern, and an upper electrode on the metal oxide pattern and the conductive pattern. The conductive pattern may have a thickness varying along the sidewall of the metal oxide pattern in a plan view.

In some embodiments, the conductive pattern may include a metal included in the metal oxide pattern.

In some embodiments, the conductive pattern may include a heavy metal.

In some embodiments, the conductive pattern may further include a conductive material included in the upper electrode.

In some embodiments, the metal oxide pattern may include oxide of a heavy metal.

In some embodiments, the metal oxide pattern may have a periphery of a circle in a plan view. The thickness of the conductive pattern may gradually decrease from a first point of the periphery of the circle of the metal oxide pattern toward a second point of the periphery of the circle opposite to the first point with respect to the center of the circle.

In some embodiments, the metal oxide pattern may have a periphery of an ellipse in a plan view. The thickness of the conductive pattern may gradually decrease from a first point of the periphery of the ellipse of the metal oxide pattern toward a second point of the periphery of the ellipse opposite to the first point with respect to the center of the ellipse.

In some embodiments, the MRAM device may further include a metal pattern between the MTJ structure and the metal oxide pattern.

In some embodiments, the metal pattern may include a material having a high spin orbit coupling.

In some embodiments, the metal pattern may include a heavy metal.

In some embodiments, the metal pattern may include a metal substantially the same as that of the metal oxide pattern.

In some embodiments, the conductive pattern may be formed on at least a portion of a sidewall of the metal pattern.

In some embodiments, the conductive pattern may be formed on at least a portion of a sidewall of the upper electrode.

In some embodiments, the MTJ structure may include a fixed pattern structure, a tunnel barrier pattern and a free layer pattern sequentially stacked.

In some embodiments, each of the fixed pattern structure and the free layer pattern may have a perpendicular magnetization direction.

In some embodiments, a vertical current may flow in the conductive pattern when a vertical current is applied between the upper and lower electrodes.

In some embodiments, a horizontal current may flow in the metal oxide pattern when a vertical current is applied between the upper and lower electrodes.

According to some embodiments, there is provided an MRAM device. The MRAM device may include a lower electrode on a substrate, an MTJ structure on the lower electrode, a metal oxide pattern on the MTJ structure, and an upper electrode on the metal oxide pattern. The MTJ structure may include a fixed pattern structure having a perpendicular magnetization direction on the lower electrode, a tunnel barrier pattern on the fixed pattern structure, and a free layer pattern having a perpendicular magnetization direction on the tunnel barrier pattern. The metal oxide pattern may have a conductive portion at least at a portion of an edge thereof.

In some embodiments, the metal oxide pattern may include oxide of a heavy metal.

In some embodiments, the metal oxide pattern may have a shape of a circular cylinder or an elliptical cylinder, and the conductive portion may be formed on a periphery of the circular cylinder or the elliptical cylinder.

In some embodiments, the conductive portion may have a thickness varying along the periphery of the metal oxide pattern.

In some embodiments, the conductive portion may be formed on only a portion of the periphery of the metal oxide pattern.

In some embodiments, a portion of a vertical current applied between the upper and lower electrodes may flow in a vertical direction through the conductive portion of the metal oxide pattern, and a portion of the vertical current may flow in a horizontal direction in the metal oxide pattern.

In some embodiments, a spin orbit torque (SOT) may be generated in the free layer pattern due to the spin hall effect (SHE) and the Rashba effect (RE) by the horizontal current in the metal oxide pattern, and the magnetization direction of the free layer pattern may be switched.

According to some embodiments, there are provided methods of manufacturing an MRAM device. In such methods, a lower electrode layer may be formed on a substrate. An MTJ structure layer may be formed on the lower electrode. A metal oxide layer may be formed on the MTJ structure layer. An upper electrode layer may be formed on the metal oxide layer. The metal oxide layer, the MTJ structure layer and the lower electrode layer may be sequentially etched using the upper electrode as an etching mask to form a lower electrode, an MTJ structure and a metal oxide pattern sequentially stacked on the substrate. A conductive pattern may be formed on at least a portion of a sidewall of the metal oxide pattern.

In some embodiments, when the metal oxide layer is formed, a metal layer may be formed on the MTJ structure layer. The metal layer may be oxidized.

In some embodiments, when the metal layer is oxidized, an entire portion of the metal layer may be oxidized.

In some embodiments, when the metal layer is oxidized, only a portion of the metal layer may be oxidized.

In some embodiments, the metal layer may include a heavy metal.

In some embodiments, the metal oxide layer may include oxide of a heavy metal.

In some embodiments, when the metal oxide layer, the MTJ structure layer and the lower electrode layer are sequentially etched, a physical etching process may be performed.

In some embodiments, the physical etching process may include an ion beam etching (IBE) process or a sputtering process.

In some embodiments, the physical etching process may be performed at an angle slanted with respect to an upper surface of the substrate.

In some embodiments, the conductive pattern may be formed on the sidewall of the metal oxide pattern to have a varying thickness.

In some embodiments, the metal oxide pattern may have a periphery of a circle in a plan view. The thickness of the conductive pattern may gradually decrease from a first point of the periphery of the circle of the metal oxide pattern toward a second point of the periphery of the circle opposite to the first point with respect to the center of the circle.

In some embodiments, the metal oxide pattern may have a periphery of an ellipse in a plan view. The thickness of the conductive pattern may gradually decrease from a first point of the periphery of the ellipse of the metal oxide pattern toward a second point of the periphery of the ellipse opposite to the first point with respect to the center of the ellipse.

In some embodiments, the conductive pattern may be formed on a sidewall of the upper electrode.

In some embodiments, when the MTJ structure layer is formed on the lower electrode layer, a fixed layer structure, a tunnel barrier layer and a free layer may be sequentially formed on the lower electrode layer.

According to some embodiments, there are provided methods of manufacturing an MRAM device. In such methods, a lower electrode layer may be formed on a substrate. A fixed layer structure having a perpendicular magnetization direction may be formed on the lower electrode layer. A tunnel barrier layer may be formed on the fixed layer structure. A free layer having a perpendicular magnetization direction may be formed on the tunnel barrier layer. A metal oxide layer may be formed on the free layer. An upper electrode may be formed on the metal oxide layer. The metal oxide layer, the free layer, the tunnel barrier layer, the fixed layer structure and the lower electrode layer may be sequentially etched using the upper electrode as an etching mask to form a metal oxide pattern, a free layer pattern, a tunnel barrier pattern, a fixed pattern structure and a lower electrode, respectively. A conductive portion may be formed at least at a portion of an edge of the metal oxide pattern.

In some embodiments, when the metal oxide layer, the free layer, the tunnel barrier layer, the fixed layer structure and the lower electrode layer are sequentially etched, a physical etching process may be performed at an angle slanted with respect to an upper surface of the substrate.

In some embodiments, the conductive portion may be formed at the edge of the metal oxide pattern to have a varying thickness.

In some embodiments, when the metal oxide layer is formed on the free layer, a metal layer including a heavy metal having a high spin orbit coupling may be formed on the free layer. The metal layer may be oxidized.

In the MRAM device in accordance with some embodiments, in addition to a magnetic field by the STT, an additional magnetic field may be generated in the free layer pattern by the SOT according to the SHE and the RE, and the DMI. Thus, the threshold current density needed to switch the magnetization direction of the free layer pattern may be reduced.

Some embodiments of the present inventive concept are directed to an MRAM device that includes a lower electrode on a substrate, an MTJ structure that includes a fixed pattern structure that is on the lower electrode and that has a perpendicular magnetization direction relative to an upper surface of the fixed pattern structure, a metal oxide pattern on the MTJ structure, a conductive pattern on at least a portion of a sidewall of the metal oxide pattern, the conductive pattern having a thickness varying along the sidewall of the metal oxide pattern in a plan view, and an upper electrode on the metal oxide pattern and the conductive pattern.

In some embodiments, the metal oxide pattern has a periphery of a circle in a plan view, and the thickness of the conductive pattern gradually decreases from a first point of the periphery of the circle of the metal oxide pattern toward a second point of the periphery of the circle opposite to the first point with respect to the center of the circle.

Some embodiments provide that the metal oxide pattern has a periphery of an ellipse in a plan view, and the thickness of the conductive pattern gradually decreases from a first point of the periphery of the ellipse of the metal oxide pattern toward a second point of the periphery of the ellipse that is opposite to the first point with respect to the center of the ellipse.

Some embodiments include a metal pattern between the MTJ structure and the metal oxide pattern and that includes a material having a high spin orbit coupling.

In some embodiments, a vertical current flows in the conductive pattern when a vertical current is applied between the upper and lower electrodes and a horizontal current flows in the metal oxide pattern when a vertical current is applied between the upper and lower electrodes.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

Example embodiments will be more clearly understood from the following detailed description taken in conjunction with the accompanying drawings.

FIGS. 1 to 3 are a perspective view, a plan view and a cross-sectional view illustrating a memory unit of a magnetic random access memory (MRAM) device in accordance with some embodiments;

FIG. 4 is a graph showing the vertical current density in the free layer pattern;

FIG. 5 illustrates a horizontal current density in the memory unit in accordance with some embodiments;

FIG. 6 is a graph showing the change of the horizontal current density in the metal oxide pattern according to a horizontal thickness of the conductive pattern and a vertical thickness of the metal oxide pattern;

FIG. 7 is a graph showing magnetic fields generated by the STT, the SOT and the spin orbit interaction, respectively;

FIG. 8 is a graph showing a threshold current density needed to switch the magnetization direction of the free layer pattern according to the magnetic fields generated in FIG. 7;

FIGS. 9 to 12 are cross-sectional views illustrating stages of methods of manufacturing a memory unit of an MRAM device;

FIGS. 13 and 14 are a plan view and a cross-sectional view, respectively, illustrating a memory unit of an MRAM device in accordance with some embodiments;

FIGS. 15 to 18 are plan views illustrating memory units of an MRAM device in accordance with some embodiments;

FIGS. 19 and 20 are a plan view and a cross-sectional view, respectively, illustrating a memory unit of an MRAM device in accordance with some embodiments;

FIG. 21 is a cross-sectional view illustrating a memory unit of an MRAM device in accordance with some embodiments;

FIG. 22 is a cross-sectional view illustrating a stage of methods of forming a memory unit of an MRAM device in accordance with some embodiments;

FIG. 23 is a cross-sectional view illustrating a memory unit of an MRAM device in accordance with some embodiments;

FIG. 24 is a cross-sectional view illustrating a memory unit of an MRAM device in accordance with some embodiments;

FIGS. 25 and 26 are a perspective view and a cross-sectional view illustrating a memory unit of an MRAM device in accordance with some embodiments;

FIG. 27 is a cross-sectional view illustrating an MRAM device in accordance with some embodiments; and FIGS. 28 to 32 are cross-sectional views illustrating stages of methods of manufacturing an MRAM device in accordance with some embodiments.

DESCRIPTION OF EMBODIMENTS

Figure 1:
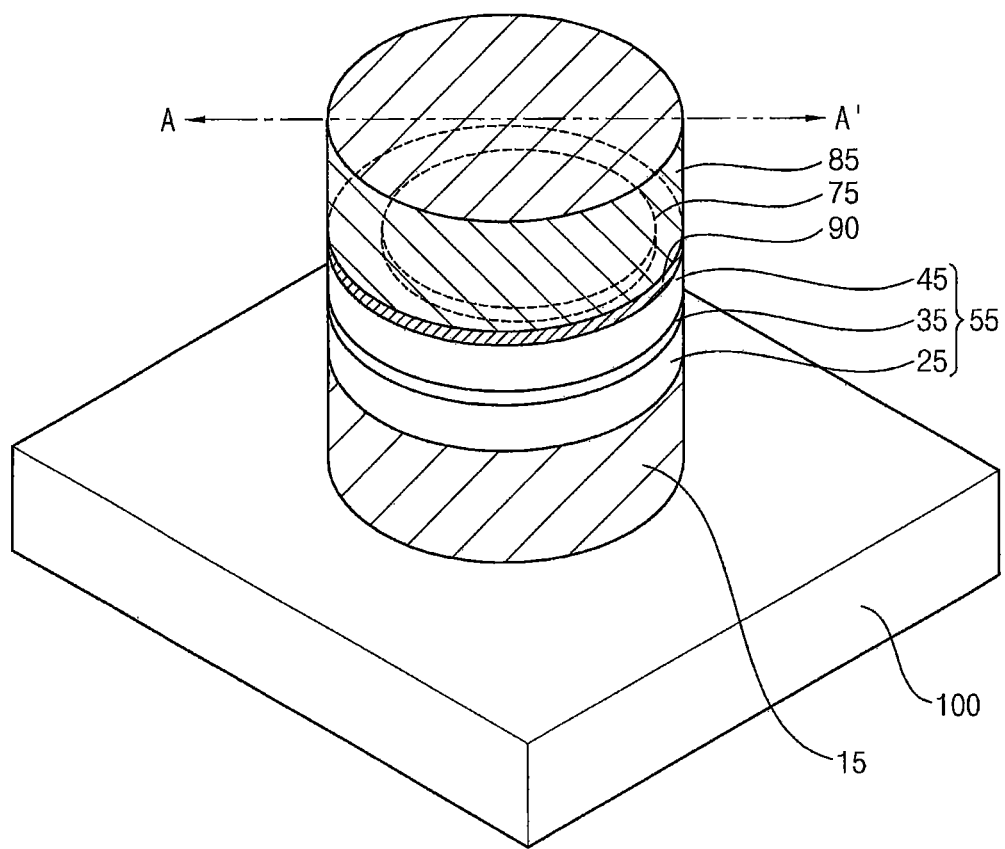
FIGS. 1 to 32 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
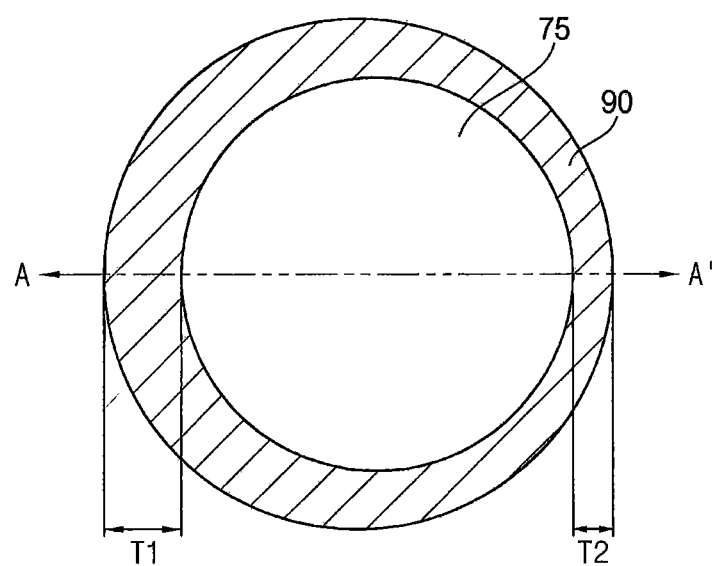
Figure 3:
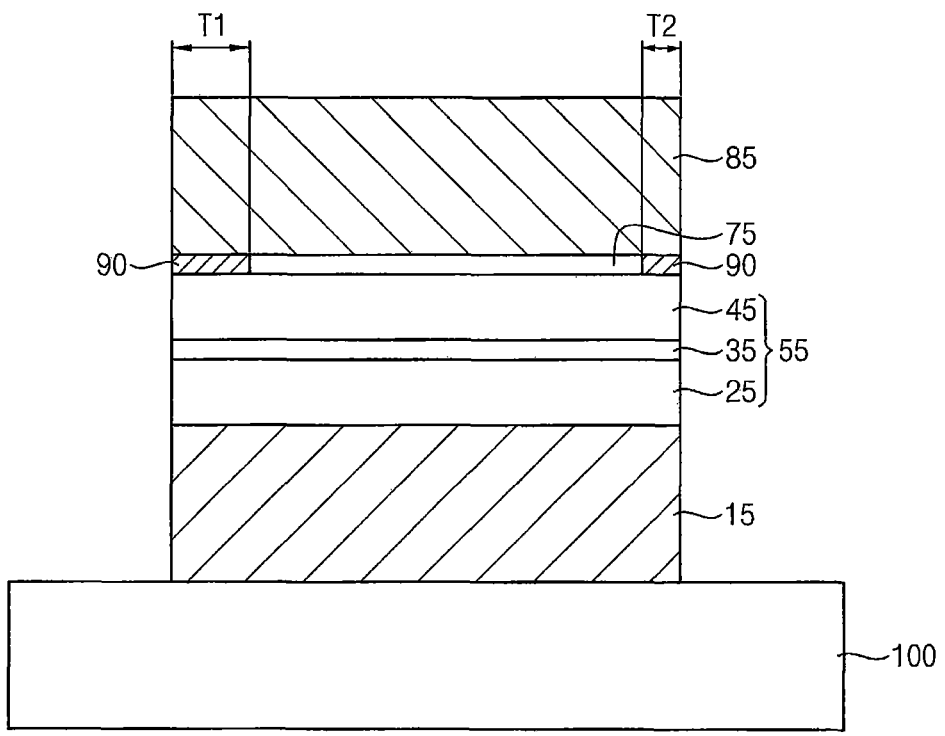

FIGS. 1 to 3 are a perspective view, a plan view and a cross-sectional view illustrating a memory unit of a magnetic random access memory (MRAM) device in accordance with some embodiments. FIG. 2 illustrates a plan view of the memory unit except for an upper electrode thereof, and FIG. 3 shows a cross-section taken along a line A-A' of FIG. 1.

Referring to FIGS. 1 to 3, the memory unit may include a lower electrode 15, a magnetic tunnel junction (MTJ) structure 55, a metal oxide pattern 75, and an upper electrode 85. The memory unit may further include a conductive pattern 90 on at least a portion of a sidewall of the metal oxide pattern 75.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate and/or a germanium-on-insulator (GOI) substrate.

Various types of elements (not shown), e.g., word lines, transistors, diodes, source/drain layers, contact plugs, wirings, etc., and/or an insulating interlayer covering the elements may be further formed on the substrate 100.

Figure 25:
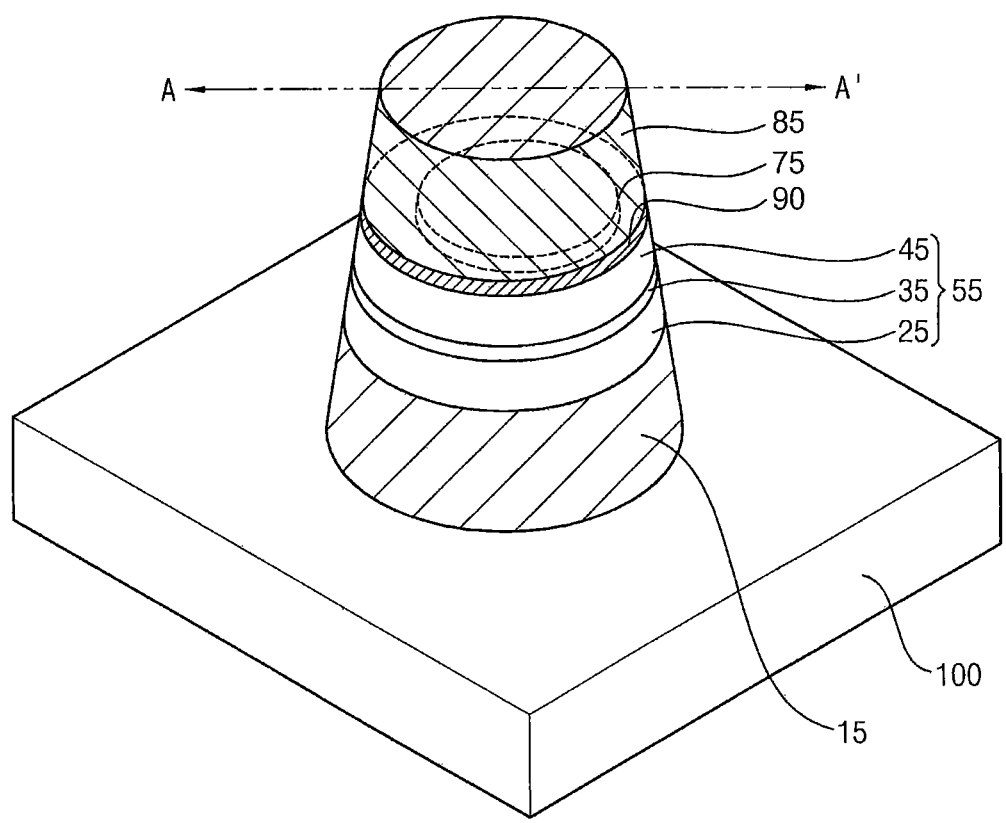
Figure 26:
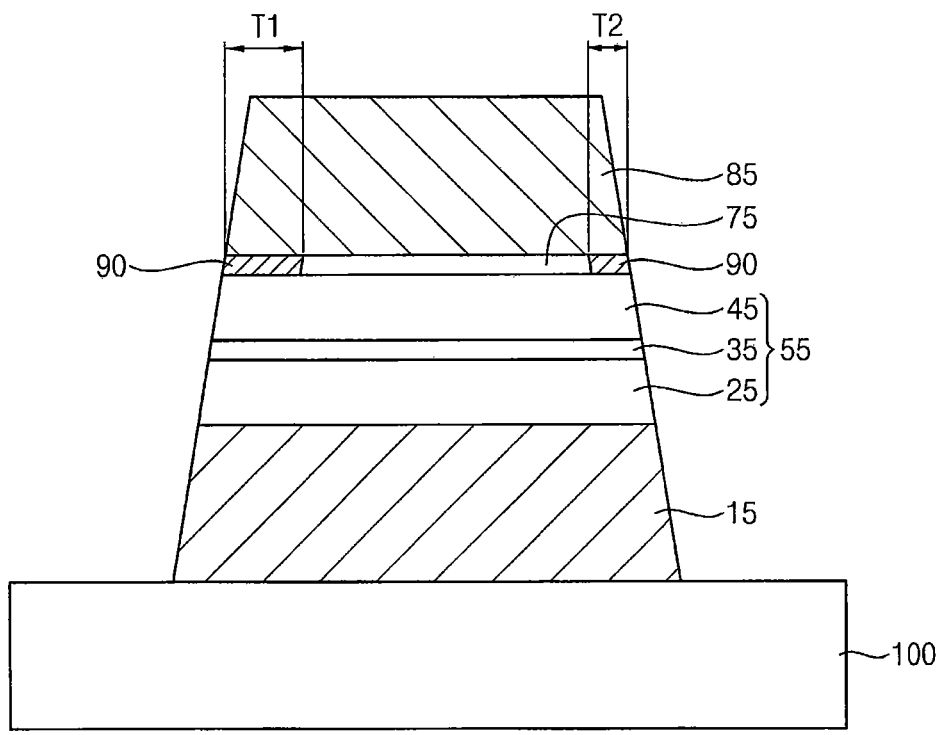

The memory unit may have a circular cylindrical shape or an elliptic cylindrical shape, and FIGS. 1 to 3 show the memory unit having the circular cylindrical shape. In some embodiments, the circular cylindrical shape may have a diameter that is constant from a top toward a bottom thereof. In some embodiments, the circular cylindrical shape may have a diameter gradually increasing from a top toward a bottom thereof, which is shown in FIGS. 25 and 26.

The lower electrode 15 and the upper electrode 85 may include a metal and/or a metal nitride. The lower electrode 15 and the upper electrode 85 may include a metal, e.g., tungsten, titanium, tantalum, etc., and/or a metal nitride, e.g., tungsten nitride, titanium nitride, tantalum nitride, etc.

The MTJ structure 55 may include a fixed pattern structure 25, a tunnel barrier pattern 35 and a free layer pattern 45 sequentially stacked.

In some embodiments, the fixed pattern structure 25 may include a pinning pattern, a lower ferromagnetic pattern, an anti-ferromagnetic coupling spacer and an upper ferromagnetic pattern.

The pinning pattern may include e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic patterns may include e.g., Fe, Ni, and/or Co. The anti-ferromagnetic coupling spacer may include e.g., Ru, Ir, and/or Rh.

The tunnel barrier pattern 35 may include e.g., aluminum oxide or magnesium oxide.

The free layer pattern 45 may include e.g., Fe, Ni, and/or Co.

The metal oxide pattern 75 may include oxide of a metal having a high spin orbit coupling. Thus, the metal oxide pattern 75 may include oxide of a heavy metal, e.g., tungsten, tantalum, platinum, and/or bismuth, among others.

The conductive pattern 90 may include the metal of the metal oxide pattern 75 and/or the metal of the upper electrode 85. Thus, the conductive pattern 90 may include e.g., tungsten, tantalum, platinum, bismuth, and/or titanium, among others.

The conductive pattern 90 may include oxide of the above-mentioned metal as the metal oxide pattern 75, however, a conductivity of the conductive pattern 90 may be greater than that of the metal oxide pattern 75. That is, the conductive pattern 90 may include a material similar to that of the metal oxide pattern 75, however, a concentration of the metal in the conductive pattern 90 may be greater than that a concentration of the metal in the metal oxide pattern 75, and the conductive pattern 90 may further include the metal of the upper electrode 85. Thus, the conductive pattern 90 may be considered as an independent pattern on a sidewall of the metal oxide pattern 75, or a portion of the metal oxide pattern 75, i.e., a conductive portion thereof. In this case, the conductive portion may have a metal concentration greater than those of other portions of the metal oxide pattern 75.

In some embodiments, the conductive pattern 90 may have a thickness varying along a periphery of the metal oxide pattern 75. For example, in a plan view, the conductive pattern 90 may have a thickness gradually decreasing from a first point of a periphery of a circle of the metal oxide pattern 75 toward a second point of the periphery of the circle opposite to the first point with respect to the center of the circle. Thus, the conductive pattern 90 may have a first thickness T1 on the first point of the circular periphery and a second thickness T2 on the second point thereof.

In some embodiments, a sum of the first and second thicknesses T1 and T2 of the conductive pattern 90 may be equal to or less than about 10% of a total diameter of the metal oxide pattern 75 and the conductive pattern 90. Thus, the total diameter of the metal oxide pattern 75 and the conductive pattern 90 may be about 40 nm, and the sum of the first and second thicknesses T1 and T2 of the conductive pattern 90 may be equal to or less than about 4 nm.

In some embodiments, the fixed pattern structure 25 and the free layer pattern 45 may have magnetization directions substantially perpendicular to respective upper surfaces thereof, and the MTJ structure 55 may be a perpendicular MTJ (p-MTJ). When a vertical current is applied between the upper and lower electrodes 85 and 15 due to the potential difference therebetween, the magnetization direction of the free layer pattern 45 may be switched to an upward direction or a downward direction due to a spin transfer torque (STT) generated by the vertical current.

The conductive pattern 90 may have a conductivity greater than that of the metal oxide pattern 75, and thus the vertical current may flow through the conductive pattern 90 more than through the metal oxide pattern 75. Accordingly, a density of the vertical current in the conductive pattern 90 may be greater than a density of the vertical current in the metal oxide pattern 90.

Figure 4:
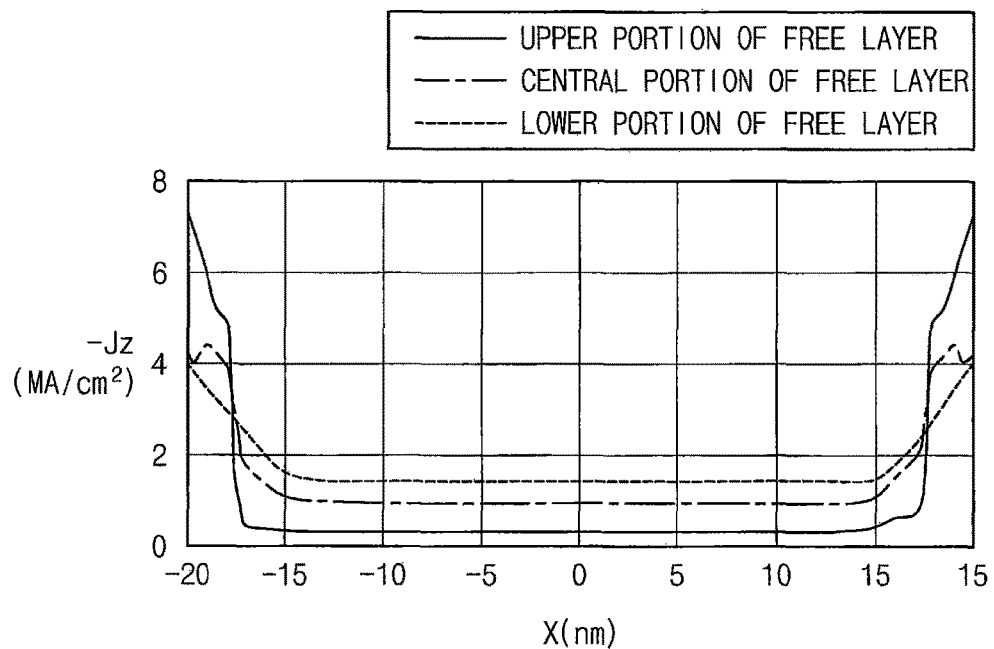

FIG. 4 is a graph showing the vertical current density in the free layer pattern. However, FIG. 4 shows a case in which the conductive pattern 90 has a constant thickness along the periphery of the metal oxide pattern 75 on the free layer pattern 45.

Referring to FIG. 4, an edge portion of the free layer pattern 45 has a vertical current density greater than that of a central portion thereof, and further an upper edge portion of the free layer pattern 45 has a vertical current density greater than that of a lower edge portion thereof. That is, the upper edge portion of the free layer pattern 45 may have a vertical current density greater than those of other portions thereof, which means that a large amount of the vertical current may flow through the conductive pattern 90 on the upper edge portion of the free layer pattern 45. Thus, even if the memory unit in accordance with some embodiments includes the conductive pattern 90 having a varying thickness, it may be presumed at least that the conductive pattern 90 may have a vertical current density greater than that of the metal oxide pattern 75.

In some embodiments, a horizontal current may also flow from the vertical current through the conductive pattern 90 and the metal oxide pattern 75, which may be illustrated with reference to FIGS. 5 and 6.

Figure 5:
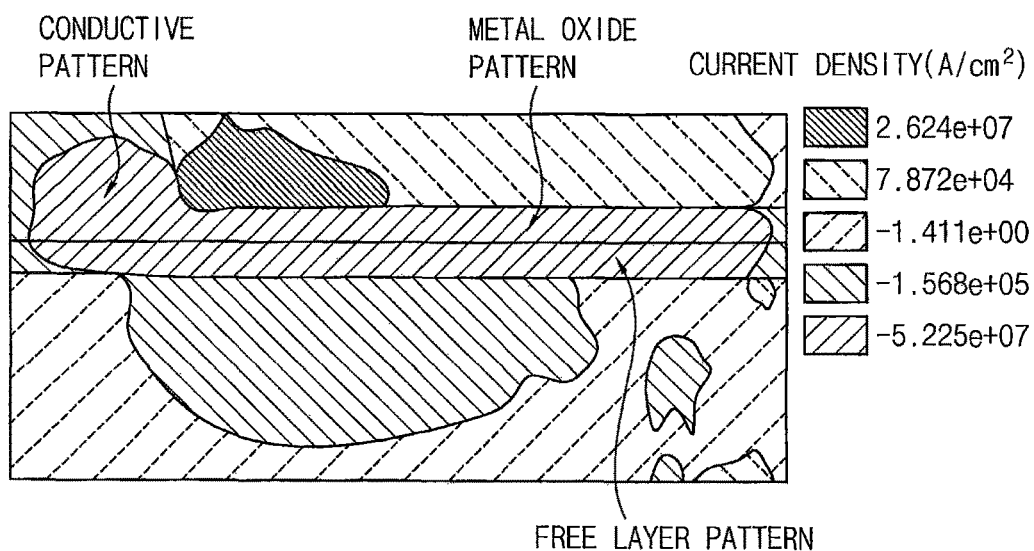
Figure 6:
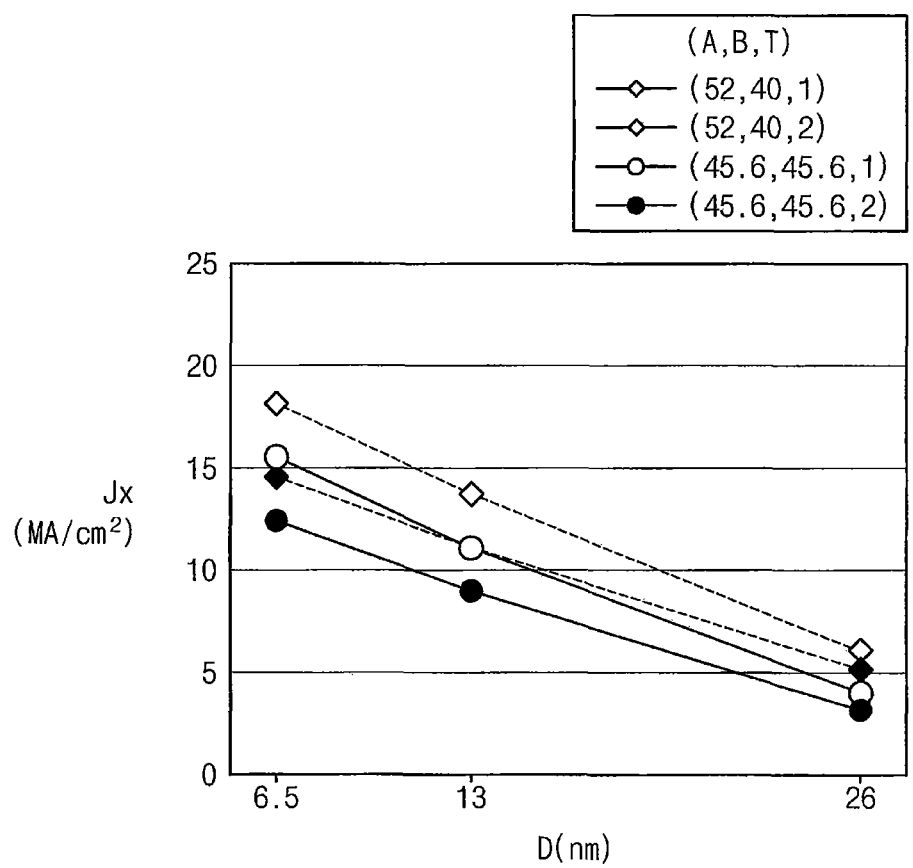

FIG. 5 illustrates a horizontal current density in the memory unit in accordance with some embodiments, and FIG. 6 is a graph showing the change of the horizontal current density in the metal oxide pattern according to a horizontal thickness of the conductive pattern and a vertical thickness of the metal oxide pattern. However, FIGS. 5 and 6 show a case in which the conductive pattern 90 having a constant thickness D is formed on a sidewall of the metal oxide pattern 75. FIG. 5 shows a horizontal current density when a vertical current density of about 2.72 MA/cm$^2$ is applied.

Referring to FIG. 5, the horizontal current densities of the respective free layer pattern 45, the metal oxide pattern 75 and the conductive pattern 90 are greater than those of other patterns in the memory unit. That is, a horizontal current may flow in the metal oxide pattern 75 by the applied vertical current.

Referring to FIG. 6, as the conductive pattern 90 is formed only on a portion of a sidewall of the metal oxide pattern 75 to have a horizontal thickness D, a horizontal current may flow in the metal oxide pattern 75, and when the horizontal thickness D excessively increases, the horizontal current density may decrease. Additionally, as a vertical thickness T of the metal oxide pattern 75 increases from about 1 nm to about 2 nm, the horizontal current density may decrease.

That is, when the conductive pattern 90 is formed on the portion of the sidewall of the metal oxide pattern 75 to have a proper horizontal thickness D, a large amount of horizontal current may flow in the metal oxide pattern 75, and the amount of the horizontal current may be changed by the vertical thickness T of the metal oxide pattern 75. In some embodiments, the metal oxide pattern 75 may have a vertical thickness T of about 1 nm to about 2 nm.

When the memory unit has an elliptical cylindrical shape, the horizontal current density of the metal oxide pattern 75 may be greater than that of the metal oxide pattern 75 having a circular cylindrical shape. When lengths of a major axis A and a minor axis B are about 52 nm and 40 nm, respectively, i.e., when the memory unit has the elliptical cylindrical shape, the horizontal current density of the metal oxide pattern 75 is greater than that of the metal oxide pattern 75 when lengths of both of the major and minor axes are about 45.6 nm, i.e., when the memory unit has the circular cylindrical shape.

The horizontal current may be applied through the metal oxide pattern 75 and the conductive pattern 90 on the free layer pattern 45 having the perpendicular magnetization direction so that the spin hall effect (SHE) and the Rashba effect (RE) may occur, and thus a spin orbit torque (SOT) may be generated in the underlying free layer pattern 45. As the metal oxide pattern 75 and the conductive pattern 90, which may include a non-magnetic material, are formed on the free layer pattern 45 including a perpendicular magnetic material, the spin orbit interaction, e.g., the Dzyaloshinskii-Moriya interaction (DMI) may be generated.

In addition to a magnetic field by the STT, an additional magnetic field may be generated in the free layer pattern 45 by the SOT according to the SHE and the RE, and the DMI. Thus, the threshold current density Jc needed to switch the magnetization direction of the free layer pattern 45 may be reduced. The magnetic field and the threshold current density Jc will be illustrated with reference to FIGS. 7 and 8.

Figure 7:
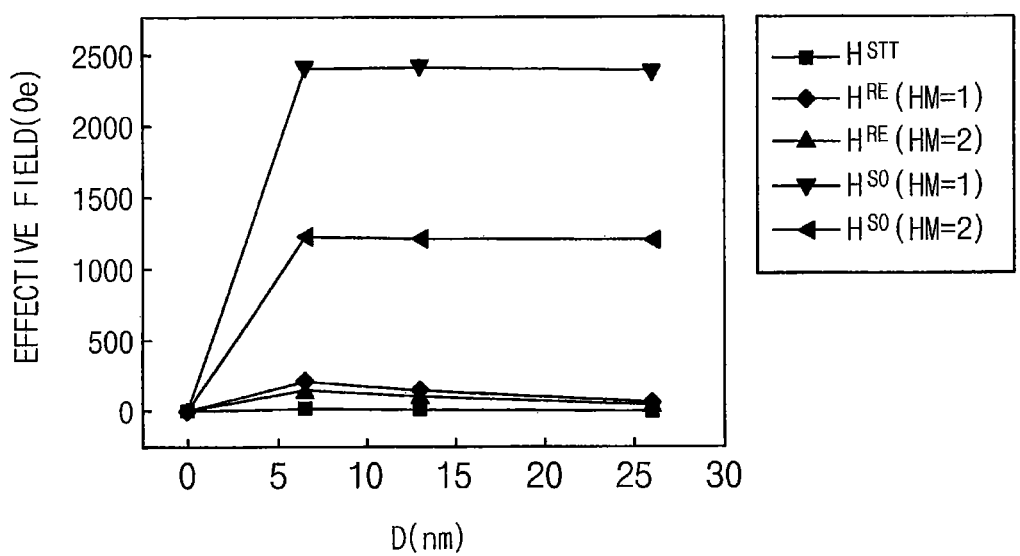
Figure 8:
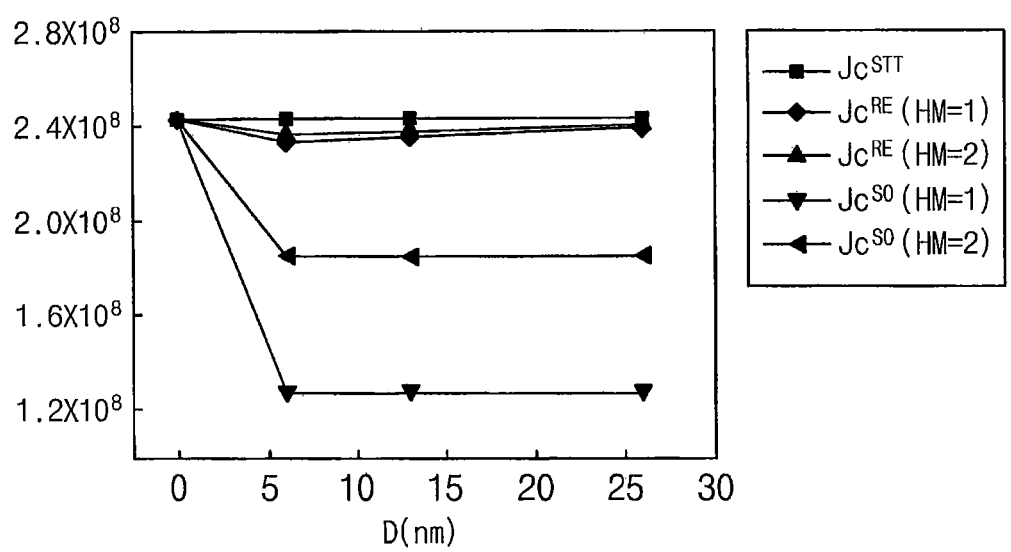

FIG. 7 is a graph showing magnetic fields generated by the STT, the SOT and the spin orbit interaction, respectively, and FIG. 8 is a graph showing a threshold current density needed to switch the magnetization direction of the free layer pattern according to the magnetic fields generated in FIG. 7.

FIG. 7 shows a magnetic field generated when a horizontal current density of about 2.72 MA/cm$_2$ is applied to the memory unit.

Referring to FIG. 7, when the vertical current is applied, a magnetic field generated by the STT is about 30 Oe, while a sum of a magnetic field $H_{RE}$ generated by the RE and a magnetic field $H_{SO}$ generated by the SHE and the DMI is about 1.5 kOe to about 2.5 kOe.

Referring to FIG. 8, the decrease of a threshold current density $Jc^{STT}$ by the STT is very small, while a sum of the decrease of a threshold current density $Jc^{RE}$ by the RE and the decrease of a threshold current density $Jc^{SO}$ by the SHE and the DMI is about 1.2 MA/cm$_2$, which may be about half of the original threshold current density of about 2.4 MA/cm$_2$, when the vertical thickness of the metal oxide pattern 75 is about 1 nm.

In some embodiments, the metal oxide pattern 75 including a heavy metal having a high spin orbit coupling may be formed on the free layer pattern 45, and the conductive pattern 90 having a varying thickness may be formed on the periphery of the metal oxide pattern 75, and thus an asymmetric vertical current may be applied in the metal oxide pattern 75 and a horizontal current may also flow therein. Accordingly, in addition to the magnetic field generated by the STT, the magnetic fields may be generated by the SOT according to the SHE and the RE and by the DMI, and the threshold current needed to switch the magnetization direction of the free layer pattern 45 may decrease.

FIGS. 9 to 12 are cross-sectional views illustrating stages of methods of manufacturing a memory unit of an MRAM device.

Figure 9:
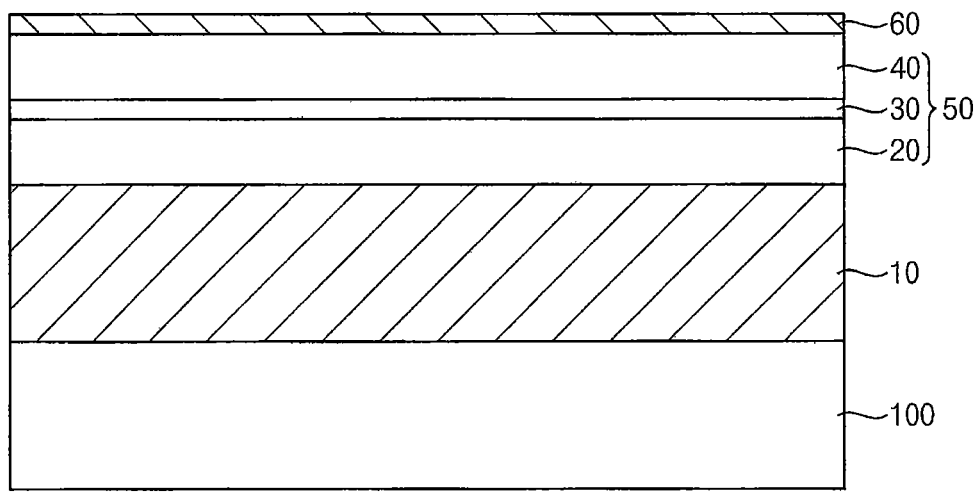

Referring to FIG. 9, a lower electrode layer 10, an MTJ structure layer 50 and a metal layer 60 may be sequentially formed on a substrate 100.

The lower electrode layer 10 may be formed of a metal and/or a metal nitride. The lower electrode layer 10 may be formed of a metal, e.g., tungsten, titanium, tantalum, etc., and/or a metal nitride, e.g., tungsten nitride, titanium nitride, tantalum nitride, etc.

The MTJ structure layer 50 may include a fixed layer structure 20, a tunnel barrier layer 30 and a free layer 40 sequentially stacked.

In some embodiments, the fixed layer structure 20 may include a pinning layer, a lower ferromagnetic layer, an anti-ferromagnetic coupling spacer layer and an upper ferromagnetic layer.

The pinning layer may be formed of e.g., FeMn, IrMn, PtMn, MnO, MnS, MnTe, MnF$_2$, FeF$_2$, FeCl$_2$, FeO, CoCl$_2$, CoO, NiCl$_2$, NiO, and/or Cr. The lower and upper ferromagnetic layers may be formed of e.g., Fe, Ni, and/or Co. The anti-ferromagnetic coupling spacer layer may be formed of e.g., Ru, Ir, and/or Rh.

The tunnel barrier layer 30 may be formed of e.g., aluminum oxide and/or magnesium oxide.

The free layer 40 may be formed of e.g., Fe, Ni, and/or Co.

The metal layer 60 may be formed of a metal having a high spin orbit coupling. Thus, the metal layer 60 may be formed of a heavy metal, e.g., tungsten, tantalum, platinum, and/or bismuth, among others.

Figure 10:
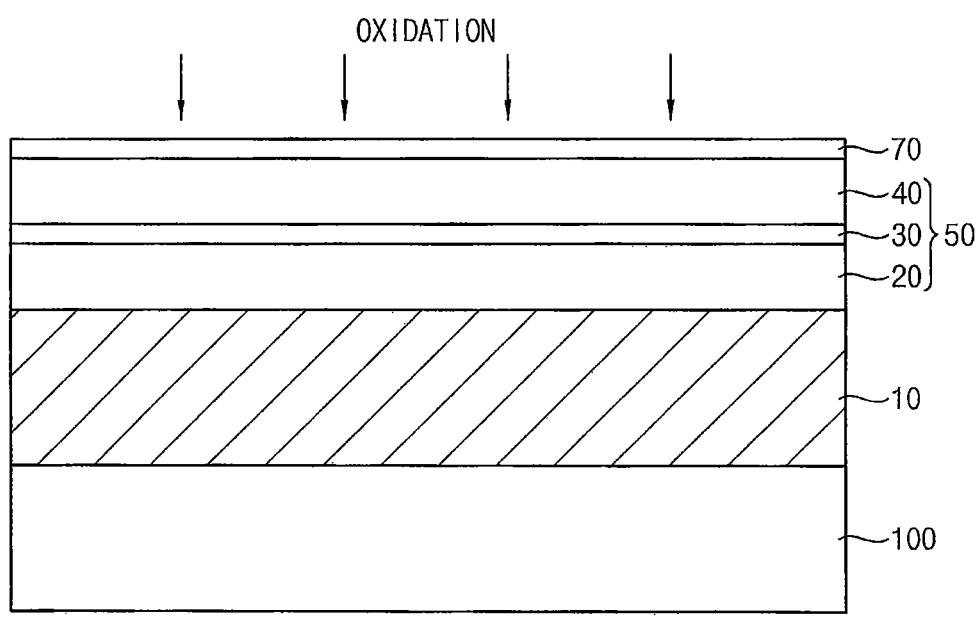

Referring to FIG. 10, the metal layer 60 may be oxidized to form a metal oxide layer 70.

In some embodiments, a thermal oxidation process may be performed on the metal layer 60 to form the metal oxide layer 70. Thus, the metal oxide layer 70 may include oxide of the heavy metal having the high spin orbit coupling.

Figure 11:
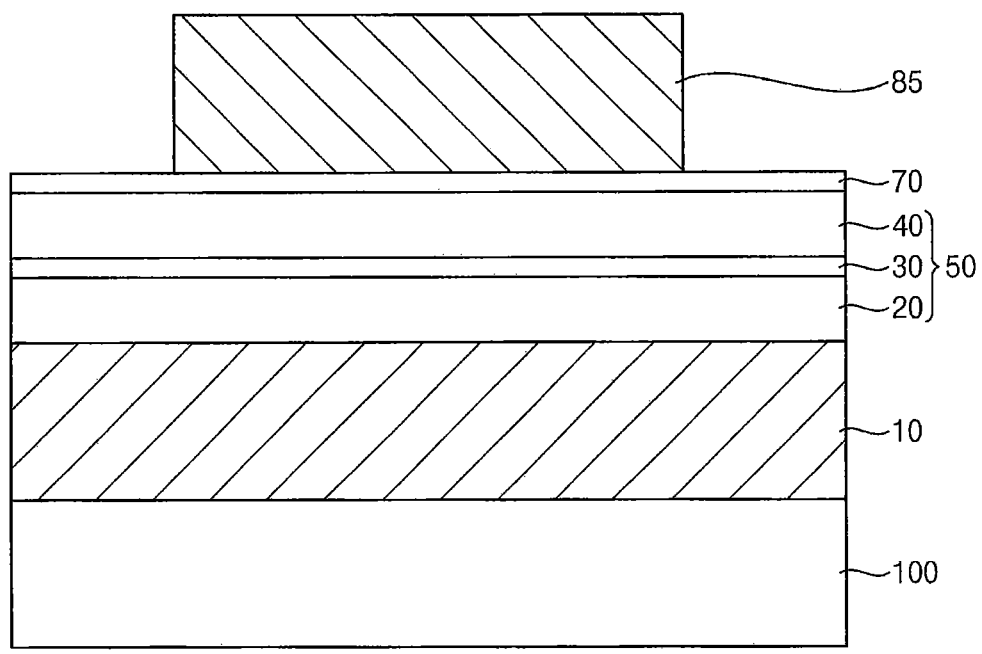

Referring to FIG. 11, an upper electrode 85 may be formed on the metal oxide layer 70.

The upper electrode 85 may be formed by forming an upper electrode layer on the metal oxide layer 70 and patterning the upper electrode layer.

The upper electrode layer may be formed of a metal and/or a metal nitride. The upper electrode layer may be formed of a metal, e.g., tungsten, titanium, tantalum, etc., and/or a metal nitride, e.g., tungsten nitride, titanium nitride, and/or tantalum nitride, among others.

Figure 12:
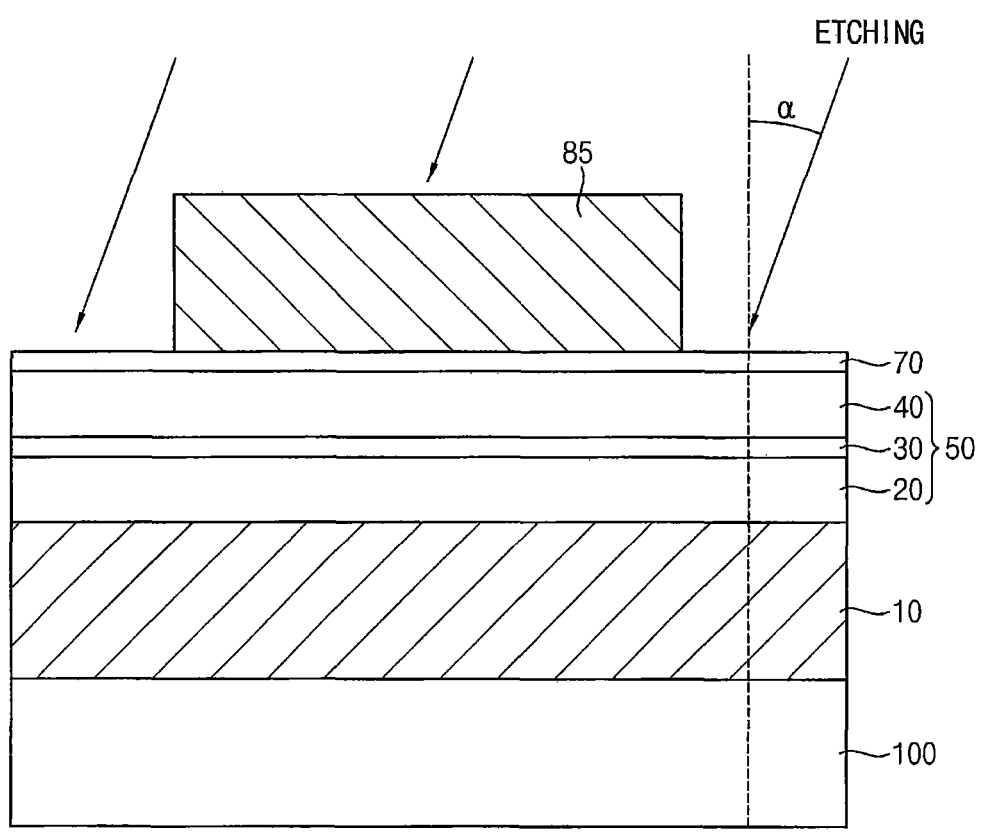

Referring to FIG. 12, a dry etching process may be performed using the upper electrode 85 as an etching mask to sequentially etch the metal oxide layer 70, the MTJ structure layer 50 and the lower electrode layer 10.

The dry etching process may include an ion beam etching (IBE) process or a sputtering process. In some embodiments, the dry etching process may be performed at an angle α with respect to a normal line that may be perpendicular to an upper surface of the substrate 100. That is, the dry etching process may be performed while rotating the substrate 100 tilted to a given angle, or by emitting ions or particles at an angle slanted with respect to the upper surface of the substrate 100.

Referring to FIGS. 1 to 3 again, a lower electrode 15, an MTJ structure 55, a metal oxide pattern 75 and the upper electrode 85 may be sequentially stacked on the substrate 100 by the dry etching process, and a conductive pattern 90 may be formed on at least a portion of a sidewall of the metal oxide pattern 75. The lower electrode 15, the MTJ structure 55, the metal oxide pattern 75, the upper electrode 85 and the upper electrode 85 may form a memory unit.

In some embodiments, the memory unit may be formed to have a circular cylindrical shape whose diameter is constant from a top toward a bottom thereof.

In some embodiments, the conductive pattern 90 may be formed to have a thickness varying along a periphery of the metal oxide pattern 75. For example, in a plan view, the conductive pattern 90 may have a thickness gradually decreasing from a first point of a periphery of a circle of the metal oxide pattern 75 toward a second point of the periphery of the circle opposite to the first point with respect to the center of the circle. Thus, the conductive pattern 90 may have a first thickness T1 on the first point of the circular periphery and a second thickness T2 on the second point thereof.

When the metal oxide layer 70 is etched to form the metal oxide pattern 75 by the dry etching process illustrated with reference to FIG. 12, a metal component of the metal oxide pattern 75 may be re-deposited on a sidewall of the metal oxide pattern 75, or the metal component of the metal oxide pattern 75 and ions and/or particles used in the dry etching process may be mixed to form the conductive pattern 90. In addition, a metal component of the upper electrode 85 on the metal oxide layer 70 may be re-deposited, or the metal component of the upper electrode 85 and ions and/or particles used in the dry etching process may be mixed to form the conductive pattern 90.

Thus, the conductive pattern 90 may be formed of the metal of the metal oxide pattern 75 and/or the metal of the upper electrode 85. That is, the conductive pattern 90 may be formed of, e.g., tungsten, tantalum, platinum, bismuth, and/or titanium, among others.

The memory unit may be formed by the above processes.

Figure 13:
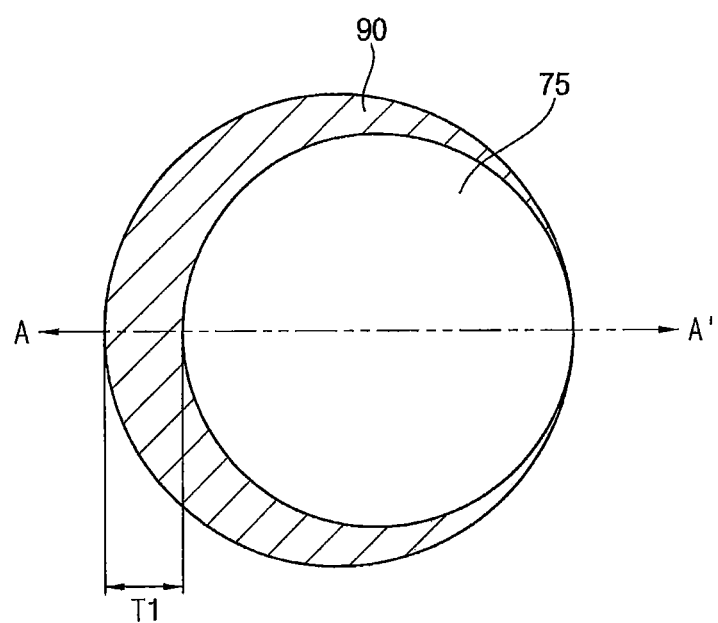
Figure 14:
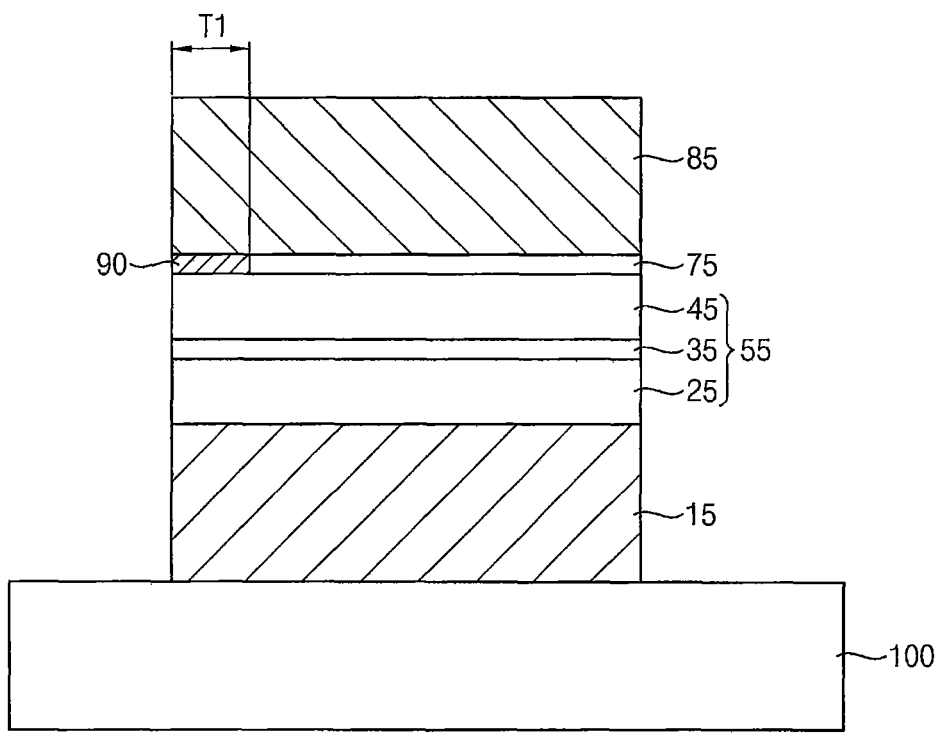

FIGS. 13 and 14 are a plan view and a cross-sectional view, respectively, illustrating a memory unit of an MRAM device in accordance with some embodiments. FIG. 13 illustrates a plan view of the memory unit except for an upper electrode thereof, and FIG. 14 shows a cross-section taken along a line A-A' of FIG. 13.

The memory unit may be substantially the same as or similar to that of FIGS. 1 to 3, except for the conductive pattern. Thus, like reference numerals refer to like elements, and detailed descriptions thereon are omitted herein.

Referring to FIGS. 13 and 14, the memory unit may include the lower electrode 15, the magnetic tunnel junction (MTJ) structure 55, the metal oxide pattern 75, and the upper electrode 85. The memory unit may further include the conductive pattern 90 on at least a portion of a sidewall of the metal oxide pattern 75.

The conductive pattern 90 may have a thickness varying along a periphery of the metal oxide pattern 75. For example, in a plan view, the conductive pattern 90 may have a thickness gradually decreasing from a first point of a periphery of a circle of the metal oxide pattern 75 toward a second point of the periphery of the circle opposite to the first point with respect to the center of the circle. Thus, the conductive pattern 90 may have a first thickness T1 on the first point of the circular periphery, and may not be formed on the second point thereof. That is, the second point of the circular periphery of the metal oxide pattern 75 may not be covered by the conductive pattern 90.

The memory unit may include the conductive pattern 90 that may be asymmetrically formed on the circular periphery of the metal oxide pattern 75, and thus a horizontal current may flow in the metal oxide pattern 75. Accordingly, similar to the memory unit of FIGS. 1 to 3, in addition to the magnetic field generated by the STT, the magnetic fields may be generated by the SOT according to the SHE and the RE, and by the DMI, and the threshold current needed to switch the magnetization direction of the free layer pattern 45 may decrease.

FIGS. 15 to 18 are plan views illustrating memory units of an MRAM device in accordance with some embodiments. FIGS. 15 to 18 illustrate plan views of the memory units except for upper electrodes thereof.

The memory units may be substantially the same as or similar to that of FIGS. 1 to 3, except for the conductive patterns and the shapes of the memory units. Thus, like reference numerals refer to like elements, and detailed descriptions thereon are omitted herein.

Figure 15:
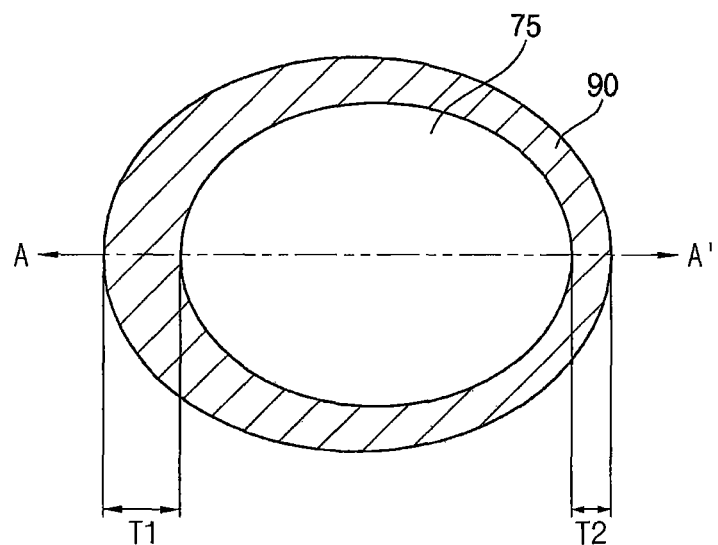

Referring to FIG. 15, the memory unit may have an elliptical cylindrical shape, and the conductive pattern 90 may be formed on a periphery of an ellipse of the metal oxide pattern 75 of the memory unit.

In some embodiments, the conductive pattern 90 may have a thickness gradually decreasing from a first point of the periphery of the ellipse of the metal oxide pattern 75 toward a second point of the periphery of the ellipse opposite to the first point with respect to the center of the ellipse. Thus, the conductive pattern 90 may have a first thickness T1 on the first point of the elliptical periphery and a second thickness T2 on the second point thereof.

In some embodiments, the first and second points of the elliptical periphery of the metal oxide pattern 75 may be points that may meet a major axis of the ellipse. The first thickness T1 may be a maximum thickness of the conductive pattern 90, and the second thickness T2 may be a minimum thickness of the conductive pattern 90.

Figure 16:
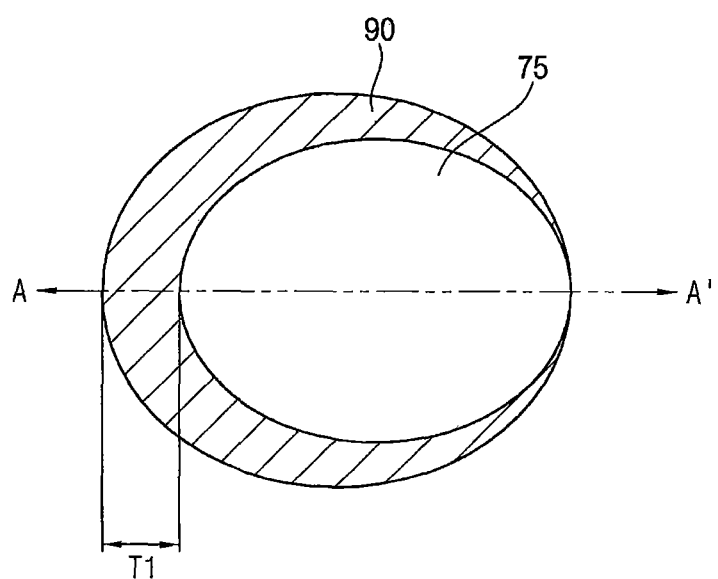

Referring to FIG. 16, the memory unit may have a shape similar to that of the memory unit of FIG. 15.

However, the conductive pattern 90 may have the first thickness T1 on the first point of the periphery of the ellipse of the metal oxide pattern 75, and may not be formed on the second point of the periphery of the ellipse opposite to the first point with respect to the center of the ellipse thereof. That is, the second point of the periphery of the ellipse of the metal oxide pattern 75 may not be covered by the conductive pattern 90.

Figure 17:
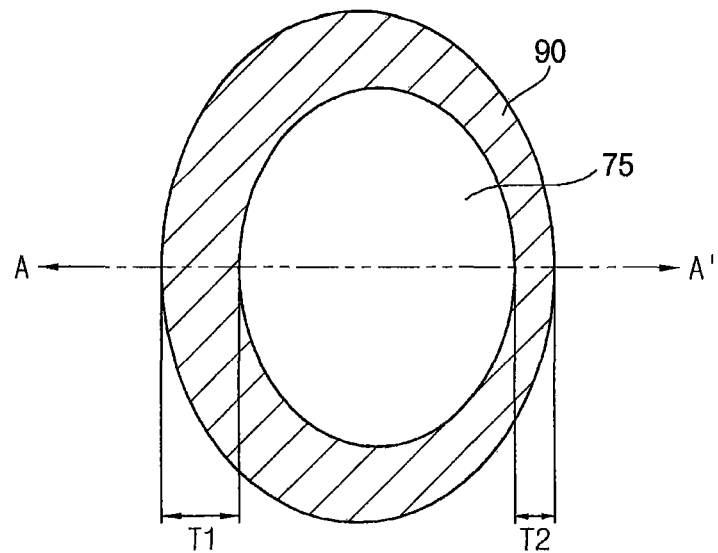

Referring to FIG. 17, the memory unit may have a shape similar to that of the memory unit of FIG. 15.

However, the first and second points of the elliptical periphery of the metal oxide pattern 75 may be points that may meet a minor axis of the ellipse. The first thickness T1 may be a maximum thickness of the conductive pattern 90, and the second thickness T2 may be a minimum thickness of the conductive pattern 90.

Figure 18:
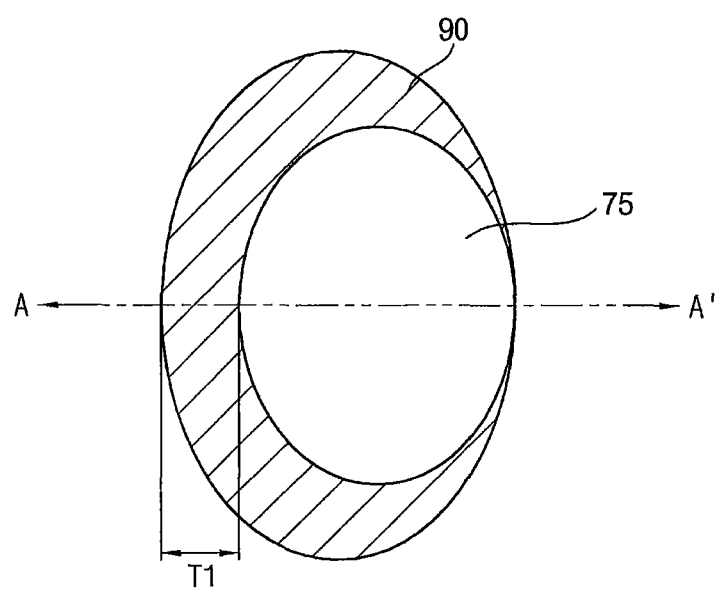

Referring to FIG. 18, the memory unit may have a shape similar to that of the memory unit of FIG. 17.

However, the conductive pattern 90 may have the first thickness T1 on the first point of the periphery of the ellipse of the metal oxide pattern 75, and may not be formed on the second point of the periphery of the ellipse opposite to the first point with respect to the center of the ellipse thereof. That is, the second point of the periphery of the ellipse of the metal oxide pattern 75 may not be covered by the conductive pattern 90.

Figure 19:
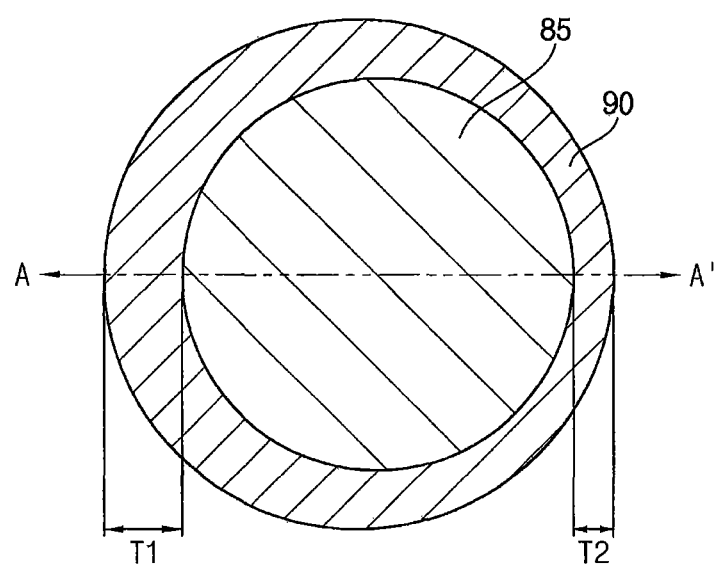
Figure 20:
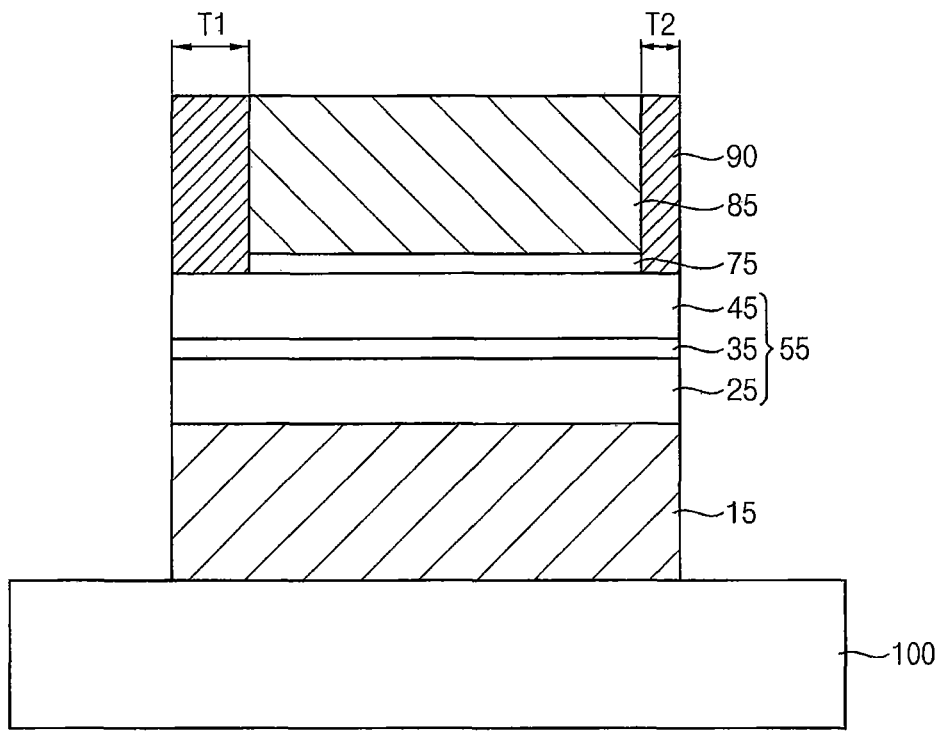

FIGS. 19 and 20 are a plan view and a cross-sectional view, respectively, illustrating a memory unit of an MRAM device in accordance with some embodiments. FIG. 20 shows a cross-section taken along a line A-A' of FIG. 19.

The memory unit may be substantially the same as or similar to that of FIGS. 1 to 3, except for the conductive pattern. Thus, like reference numerals refer to like elements, and detailed descriptions thereon are omitted herein.

Referring to FIGS. 19 and 20, the conductive pattern 90 may be formed on the sidewall of the metal oxide pattern 75 and a sidewall of the upper electrode 85 as well.

The conductive pattern 90 may be formed on a portion of the sidewall of the upper electrode 85. In some embodiments, the conductive pattern 90 may be formed on the entire sidewall of the upper electrode 85. In both cases, the conductive pattern 90 may have a varying thickness on the sidewall of the upper electrode 85. In some embodiments, the conductive pattern 90 may have the first thickness T1 on a first point of a periphery of a circle of the upper electrode 85 and the second thickness T2 on a second point of the periphery of the circle opposite to the first point with respect to the center of the circle thereof.

Figure 21:
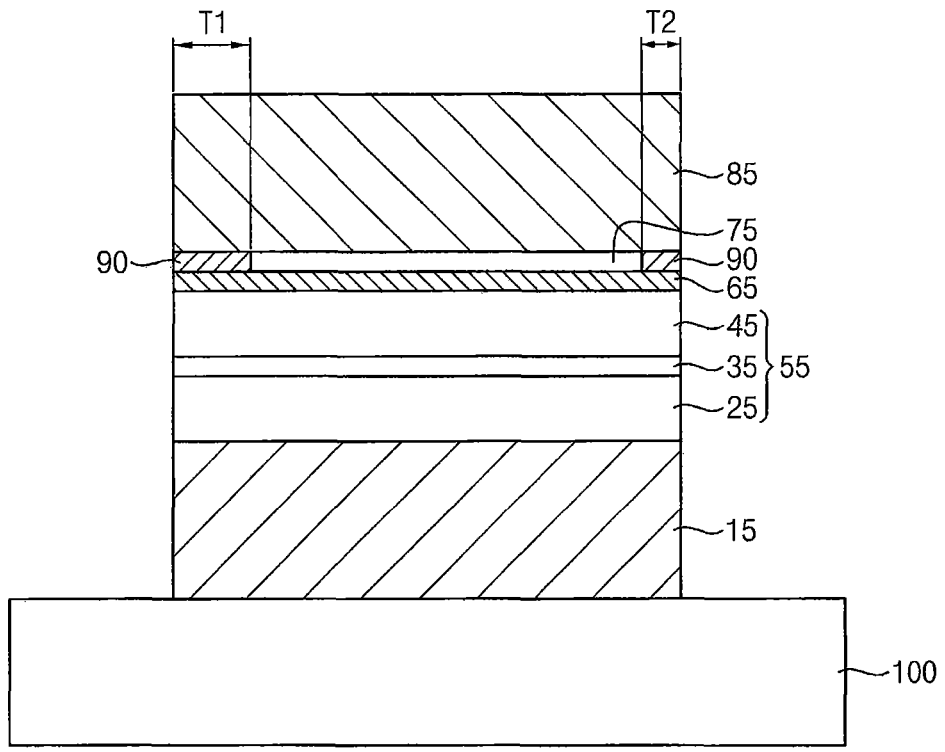

FIG. 21 is a cross-sectional view illustrating a memory unit of an MRAM device in accordance with some embodiments.

The memory unit may be substantially the same as or similar to that of FIGS. 1 to 3, except for a metal pattern. Thus, like reference numerals refer to like elements, and detailed descriptions thereon are omitted herein.

Referring to FIG. 21, the memory unit may further include a metal pattern 65 between the free layer pattern 45 and the metal oxide pattern 75.

The metal pattern 65 may include oxide of a metal having a high spin orbit coupling. Thus, the metal pattern 65 may include oxide of a heavy metal, e.g., tungsten, tantalum, platinum, and/or bismuth, among others. In some embodiments, the metal pattern 65 may have a thickness equal to or less than about 2 nm.

In some embodiments, as a vertical current is applied between the upper and lower electrodes 85 and 15, a horizontal current may flow in the metal pattern 65, which may be similar to that in the metal oxide pattern 75. Thus, in addition to a magnetic field by the STT, an additional magnetic field may be generated in the free layer pattern 45 by the SOT according to the SHE and the RE, and the DMI, and the threshold current density needed to switch the magnetization direction of the free layer pattern 45 may be reduced.

Figure 22:
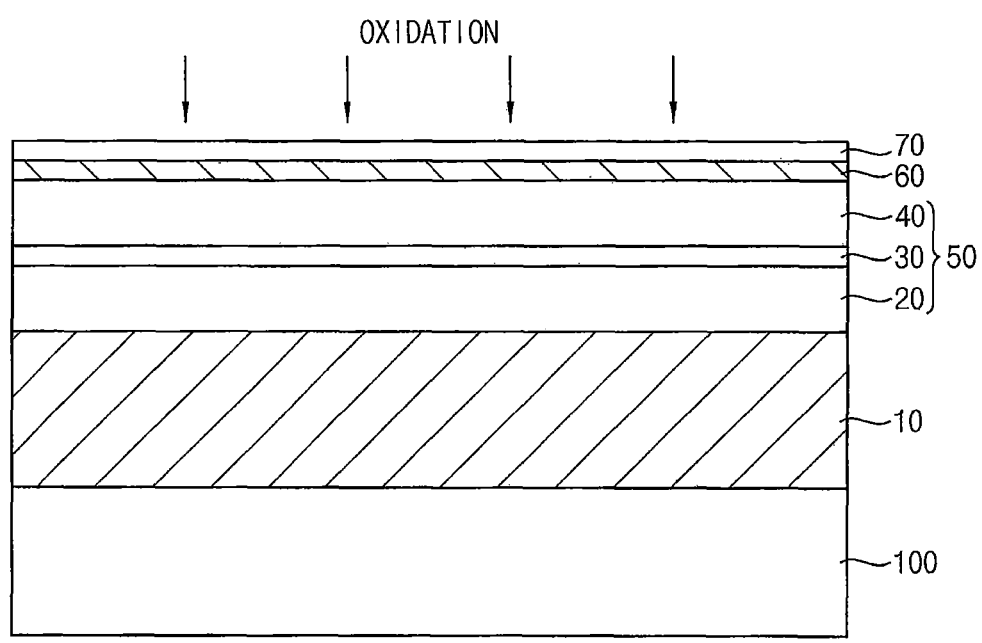

FIG. 22 is a cross-sectional view illustrating a stage of methods of forming a memory unit of an MRAM device in accordance with some embodiments. Such methods may include processes substantially the same as or similar to those illustrated with reference to FIGS. 9 to 12 and FIGS. 1 to 3, and thus detailed descriptions thereon are omitted herein.

First, processes substantially the same as or similar to those illustrated with reference to FIGS. 9 and 10 may be performed.

However, the metal layer 60 may not be completely oxidized, but only an upper portion of the metal layer 60 may be oxidized to form the metal oxide layer 70, and thus a lower portion of the metal layer 60 may not be oxidized but remain.

Processes substantially the same as or similar to those illustrated with reference to FIGS. 11 to 12 and FIGS. 1 to 3 may be performed to complete the memory unit.

The memory unit may include a metal pattern 65 between the free layer pattern 45 and the metal oxide pattern 75.

Figure 23:
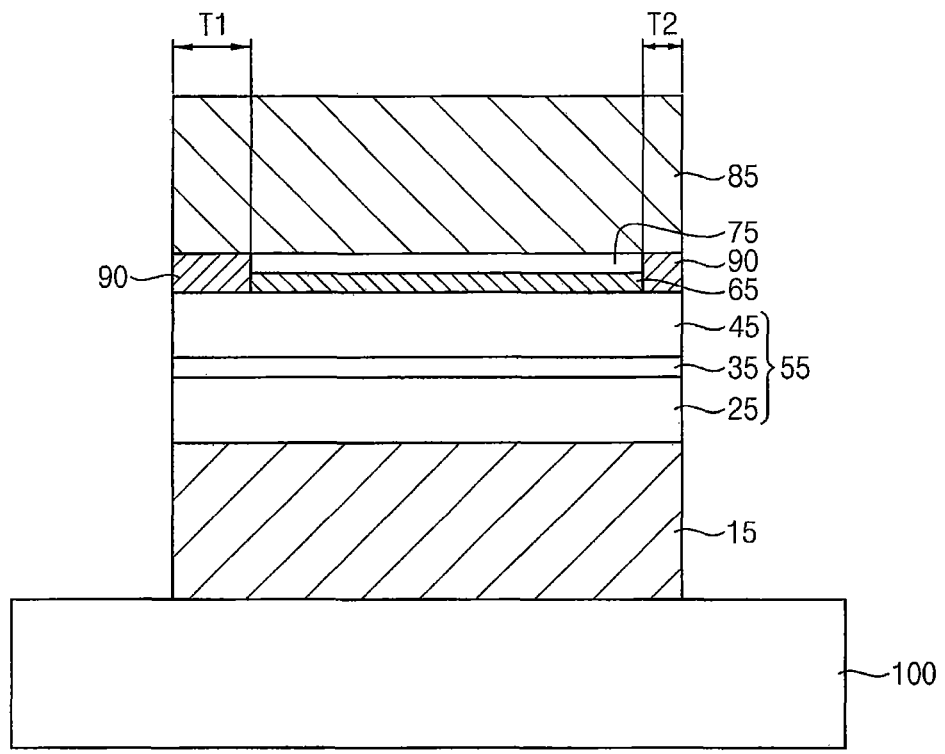

FIG. 23 is a cross-sectional view illustrating a memory unit of an MRAM device in accordance with some embodiments.

The memory unit may be substantially the same as or similar to that of FIG. 21, except for the conductive pattern. Thus, like reference numerals refer to like elements, and detailed descriptions thereon are omitted herein.

Referring to FIG. 23, the conductive pattern 90 may be formed on a sidewall of the metal oxide pattern 75 and a sidewall of the metal pattern 65 as well.

The conductive pattern 90 may be formed on a portion of the sidewall of the metal pattern 65, or on the entire sidewall of the metal pattern 65. The conductive pattern 90 may be formed on the sidewall of the metal pattern 65 to have a varying thickness. In some embodiments, the conductive pattern 90 may have the first thickness T1 on a first point of a periphery of a circle of the metal pattern 65 and the second thickness T2 on a second point of the periphery of the circle opposite to the first point with respect to the center of the circle thereof.

Figure 24:
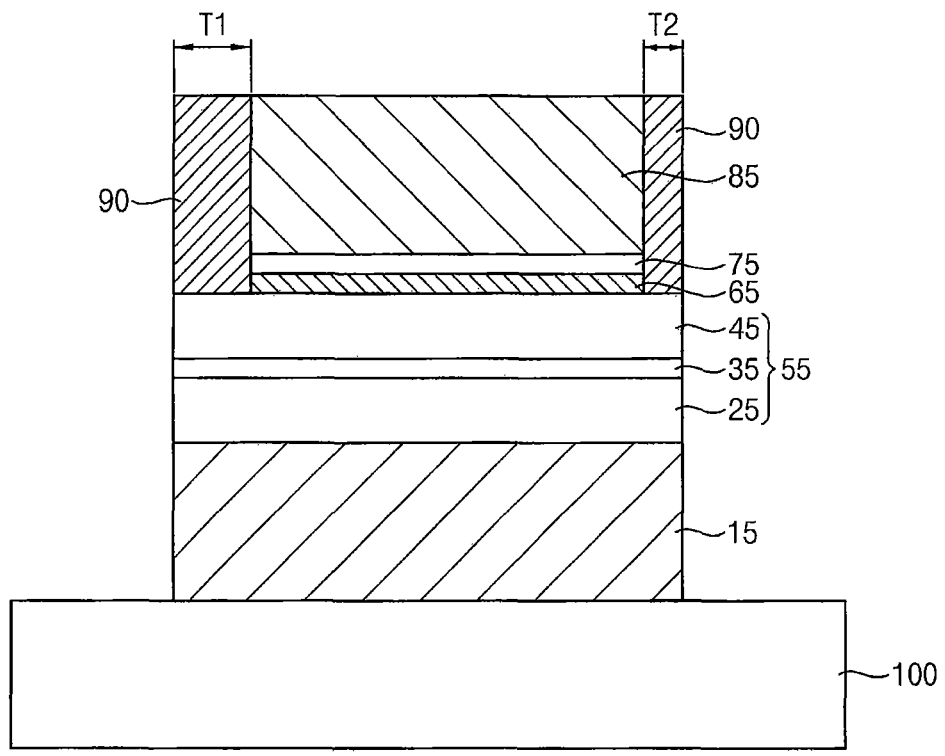

FIG. 24 is a cross-sectional view illustrating a memory unit of an MRAM device in accordance with some embodiments.

The memory unit may be substantially the same as or similar to that of FIG. 23, except for the conductive pattern. Thus, like reference numerals refer to like elements, and detailed descriptions thereon are omitted herein.

Referring to FIG. 24, the conductive pattern 90 may be formed on the sidewalls of the metal oxide pattern 75 and the metal pattern 65 and a sidewall of the upper electrode 85 as well.

The conductive pattern 90 may be formed on a portion of the sidewall of the upper electrode 85, or on the entire sidewall of the upper electrode 85. The conductive pattern 90 may be formed on the sidewall of the upper electrode 85 to have a varying thickness. In some embodiments, the conductive pattern 90 may have the first thickness T1 on a first point of a periphery of a circle of the upper electrode 85 and the second thickness T2 on a second point of the periphery of the circle opposite to the first point with respect to the center of the circle thereof.

FIGS. 25 and 26 are a perspective view and a cross-sectional view illustrating a memory unit of an MRAM device in accordance with some embodiments. FIG. 26 shows a cross-section taken along a line A-A' of FIG. 25.

The memory unit may be substantially the same as or similar to that of FIGS. 1 to 3, except for the shape thereof. Thus, like reference numerals refer to like elements, and detailed descriptions thereon are omitted herein.

The memory unit may have a diameter gradually increasing from a top toward a bottom thereof, and thus a vertical cross-section of the memory unit may have a shape of a trapezoid.

Figure 27:
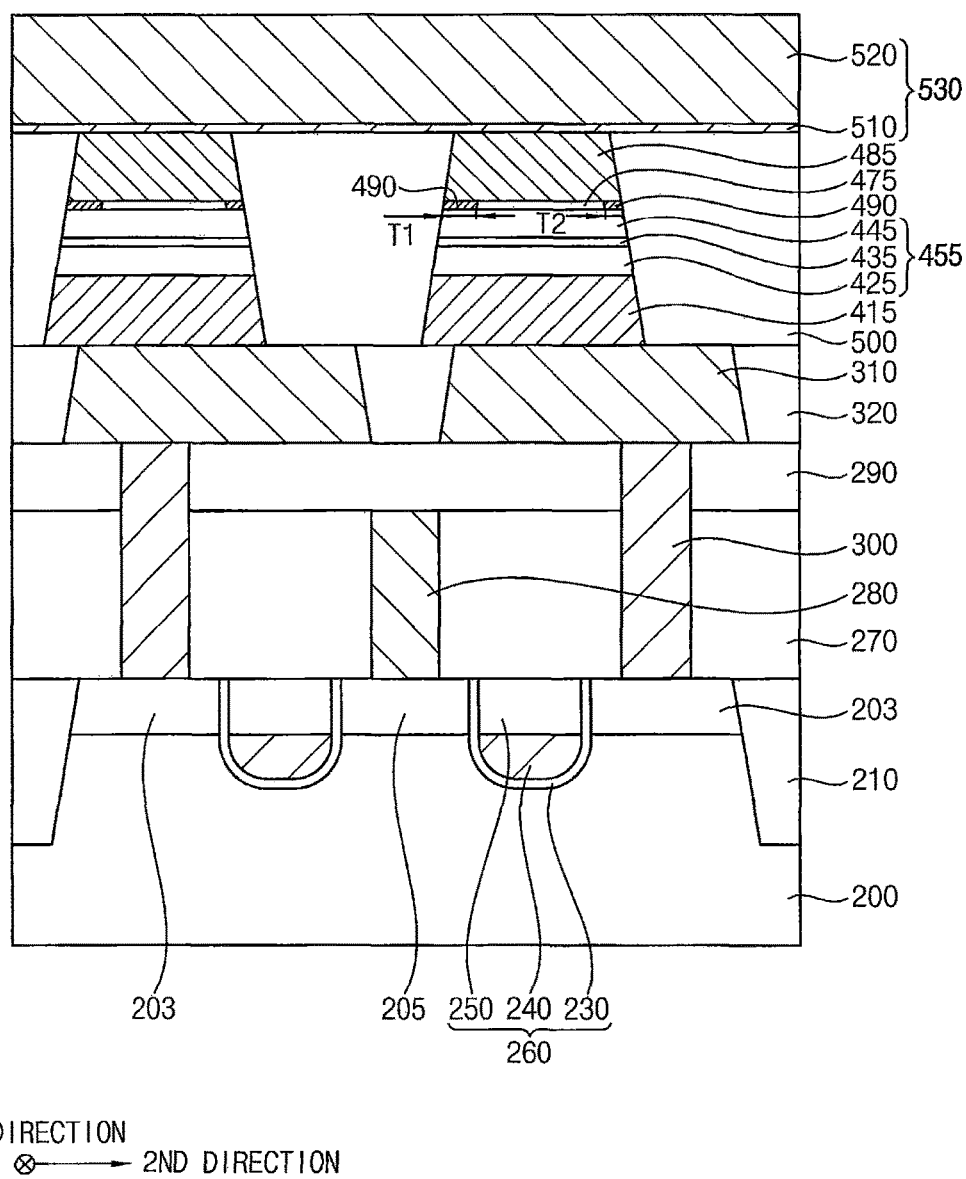

FIG. 27 is a cross-sectional view illustrating an MRAM device in accordance with some embodiments. The MRAM device may include a memory unit substantially the same as or similar to that of FIGS. 1 to 3, and thus detailed descriptions thereon are omitted herein.

The MRAM device may include other memory units instead that of FIGS. 1 to 3, e.g., the memory units illustrated with reference to FIGS. 13 to 14, 15 to 18, 19 to 20, 21, 23, 24, 25 to 26, and 27.

Referring to FIG. 27, the MRAM device may include a transistor, a source line 280, a contact plug 300, a conductive pad 310, a memory unit, and a wiring 530 on a substrate 200. The MRAM device may further include first to third insulating interlayers 270, 290 and 500 and an insulation layer 320.

An isolation layer 210 may be formed on the substrate 200, and thus the substrate 200 may be divided into an active region and a field region. The isolation layer 210 may fill a first trench (not shown) on a substrate 200, and may include an oxide, e.g. silicon oxide.

The transistor may include a gate structure 260 and impurity regions 203 and 205.

The gate structure 260 may fill a second trench (not shown) on the active region of the substrate 200. The gate structure 260 may extend in a first direction substantially parallel to an upper surface of the substrate 200, and a plurality of gate structures 260 may be formed in a second direction substantially parallel to the upper surface of the substrate 200 and substantially perpendicular to the first direction. In some embodiments, two gate structures 260 may be formed to be spaced apart from each other in the second direction in one active region.

The gate structure 260 may include a gate insulation layer 230 on an inner wall of the second trench, a gate electrode 240 filling a lower portion of the second trench on the gate insulation layer 230, and a capping pattern 250 filling an upper portion of the second trench on the gate insulation layer 230 and the gate electrode 240.

The gate insulation layer 230 may include silicon oxide or a metal oxide. The metal oxide may include, e.g., hafnium oxide, tantalum oxide, and/or zirconium oxide, among others. The gate electrode 240 may include a metal, a metal nitride and/or a metal silicide, e.g., tungsten, titanium nitride, and/or tantalum nitride, among others. The capping pattern 250 may include silicon oxide and/or silicon nitride.

The first and second impurity regions 203 and 205 may be formed at upper portions of the active region of the substrate 200 adjacent the gate structure 260. In some embodiments, two first impurity regions 203 and one second impurity region 205 may be formed in one active region. The first and second impurity regions 203 and 205 may include n-type impurities, e.g., phosphorus, arsenic, etc., or p-type impurities, e.g., boron, gallium, etc.

The first insulating interlayer 270 may be formed on the gate structure 260, the substrate 200 and the isolation layer 210, and the source line 280 may extend through the first insulating interlayer 270 to contact an upper surface of the second impurity region 205.

The source line 280 may extend in the first direction, and a plurality of source lines 280 may be formed in the second direction. In some embodiments, the source line 280 may be formed on portions of the substrate 200 and the isolation layer 210 between neighboring ones of the gate structures 260.

The first insulating interlayer 270 may include an oxide, e.g., silicon oxide, and the source line 280 may include a metal, e.g., tungsten, titanium, and/or tantalum, among others, a metal nitride, e.g., tungsten nitride, titanium nitride, and/or tantalum nitride, among others, and/or doped polysilicon.

The second insulating interlayer 290 may be formed on the first insulating interlayer 270 and the source line 280, and the contact plug 300 may extend through the first and second insulating interlayers 270 and 290 to contact an upper surface of the first impurity region 203.

A plurality of contact plugs 300 may be formed in both of the first and second directions. In some embodiments, two contact plugs 300 may be formed to contact two first impurity regions 203, respectively, in each active region.

The conductive pads 310 may contact upper surfaces of the contact plugs 300, respectively, and the insulation layer 320 may fill spaces between the conductive pads 310.

The conductive pads 310 may include a metal, e.g., tungsten, titanium, and/or tantalum, among others, and/or a nitride, e.g., tungsten nitride, titanium nitride, and/or tantalum nitride, among others, and the insulation layer 320 may include a nitride, e.g., silicon nitride.

The memory unit may include a lower electrode 415, an MTJ structure 455, a metal oxide pattern 475 and an upper electrode 485 sequentially stacked on each conductive pad 310. A conductive pattern 490 may be formed on at least a portion of a sidewall of the metal oxide pattern 475.

In some embodiments, the MTJ structure 455 may include a fixed pattern structure 425, a tunnel barrier pattern 435 and a free layer pattern 445.

The third insulating interlayer 500 may cover the memory unit, and may be formed on the conductive pads 310 and the insulation layer 320.

The wiring 530 may extend through a portion of the third insulating interlayer 500 to contact an upper surface of the memory unit. A plurality of wirings 530 may be formed in the first direction, and each of the wirings 530 may serve as a bit line of the MRAM device. In some embodiments, the wiring 530 may include a metal pattern 520 and a barrier pattern 510 covering a bottom and a sidewall of the metal pattern 520.

The MRAM device may include the metal oxide pattern 475 and the conductive pattern 490 on the sidewall thereof on the free layer pattern 445 of the MTJ structure 455, and thus, in addition to a magnetic field by the STT, an additional magnetic field may be generated in the free layer pattern 445 by the SOT according to the SHE and the RE, and the DMI. Thus, the threshold current density needed to switch the magnetization direction of the free layer pattern 445 may be reduced.

FIGS. 28 to 32 are cross-sectional views illustrating stages of methods of manufacturing an MRAM device in accordance with some embodiments.

Figure 28:
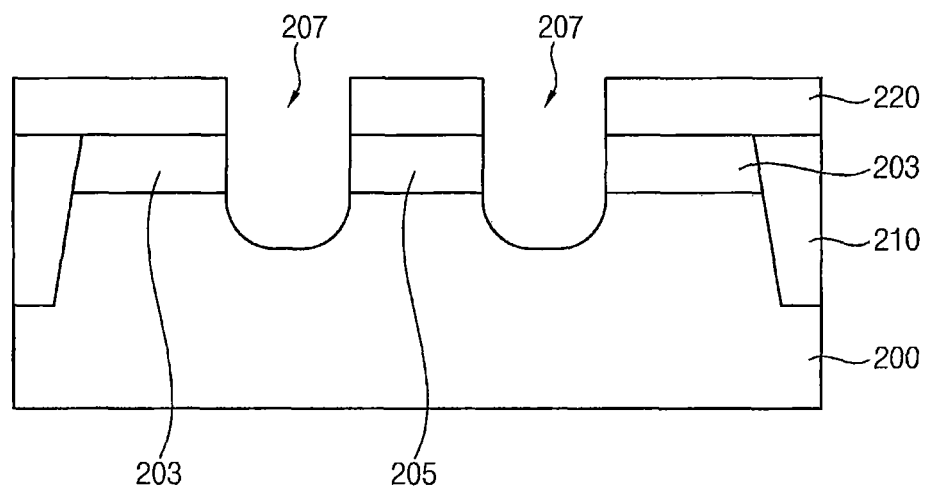

Referring to FIG. 28, impurities may be implanted into an upper portion of a substrate 200 to form an impurity region, and an isolation layer 210 may be formed on the substrate 200 to divide the substrate 200 into an active region and a field region.

The impurities may include n-type impurities, e.g., phosphorus, arsenic, etc., or p-type impurities, e.g., boron, gallium, etc.

The isolation layer 210 may be formed by a shallow trench isolation (STI) process. Particularly, a first trench (not shown) may be formed on the substrate 200, an insulation layer may be formed on the substrate 200 to sufficiently fill the first trench, and the insulation layer may be planarized until an upper surface of the substrate 200 may be exposed. The insulation layer may be formed by a chemical vapor deposition (CVD) process, a high density plasma chemical vapor deposition (HDP-CVD) process, etc. In some embodiments, before forming the isolation layer 210, a liner (not shown) may be further formed on an inner wall of the first trench to include a nitride.

Instead of forming the impurity region before forming the isolation layer 210, the impurity region may be formed after forming the isolation layer 210.

An upper portion of the substrate 200 may be partially removed to form a second trench 207.

In some embodiments, a mask layer may be formed on the substrate 200, and may be patterned by a photolithography process to form a mask 220. An upper portion of the substrate 200 may be etched using the mask 220 as an etching mask to form a second trench 207. In some embodiments, the second trench 207 may be formed to extend in a first direction substantially parallel to the upper surface of the substrate 200, and a plurality of second trenches 207 may be formed in a second direction substantially parallel to the upper surface of the substrate 200 and substantially perpendicular to the first direction. In some embodiments, two second trenches 207 may be formed in each active region divided by the isolation layer 210. As the second trenches 204 are formed, the impurity region may be divided into first and second impurity regions 203 and 205.

The mask layer may be formed of, e.g., silicon oxide.

Figure 29:
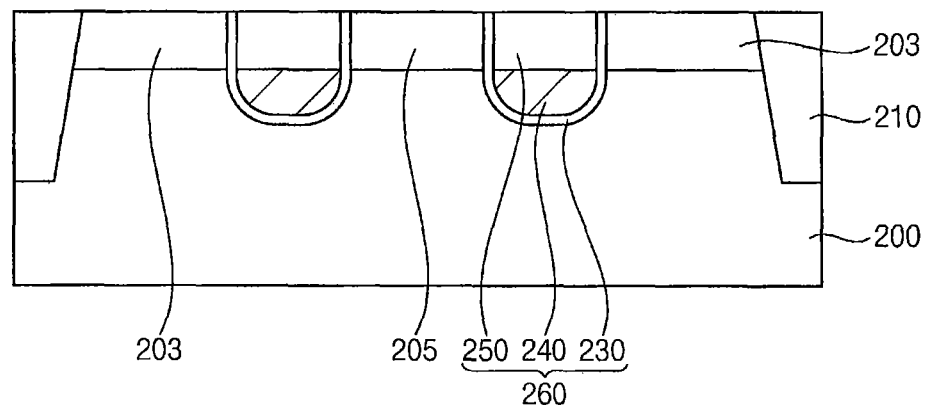

Referring to FIG. 29, a gate insulation layer 230 may be formed on an inner wall of the second trench 207, and a gate electrode layer may be formed on the gate insulation layer 230 and the mask 220 to sufficiently fill the second trench 207.

In some embodiments, the gate insulation layer 230 may be formed by performing a thermal oxidation process or a radical oxidation on the upper portion of the substrate 200 exposed by the second trench 207. In some embodiments, the gate insulation layer 230 may be formed by forming a silicon oxide layer or a metal oxide layer on the inner wall of the second trench 207 and the mask 220 through a CVD process, and removing a portion of the silicon oxide layer or the metal oxide layer on the mask 220. The metal oxide layer may be formed of, e.g., hafnium oxide, tantalum oxide, and/or zirconium oxide, among others.

The gate electrode layer may be formed of a metal, a metal nitride and/or a metal silicide, e.g., tungsten, titanium nitride, and/or tantalum nitride, among others, by an atomic layer deposition (ALD) process, a physical vapor deposition (PVD) process, etc.

An upper portion of the gate electrode layer may be removed to form a gate electrode 240 partially filling the second trench 207, and a capping layer may be formed on the gate electrode 240, the gate insulation layer 230 and the mask 220 to fill a remaining portion of the second trench 207.

In some embodiments, the gate electrode layer may be planarized until an upper surface of the mask 220 may be exposed by a CMP process, and an upper portion of the gate electrode layer in the second trench 207 may be removed by an anisotropic etching process to form the gate electrode 240. Thus, the gate electrode 240 may fill a lower portion of the second trench 207. In some embodiments, the gate electrode 240 may extend in the first direction, and a plurality of gate electrodes 240 may be formed in the second direction.

The capping layer may be formed of, e.g., silicon oxide, silicon nitride, etc.

An upper portion of the capping layer and the mask 220 may be removed by a CMP process until the upper surface of the substrate 200 may be exposed to form a capping pattern 250.

Thus, the capping pattern 250 may fill an upper portion of the second trench 207. In some embodiments, the capping pattern 250 may extend in the first direction, and a plurality of capping patterns 250 may be formed in the second direction.

The gate insulation layer 230, the gate electrode 240 and the capping pattern 250 may form a gate structure 260, and may be a buried structure filling the second trench 207 on the substrate 200. The gate structure 260 may extend in the first direction, and a plurality of gate structures 260 may be formed in the second direction. The gate structure 260 may serve as a word line of the MRAM device. The gate structure 260 and the impurity regions 203 and 205 may form a transistor.

Figure 30:
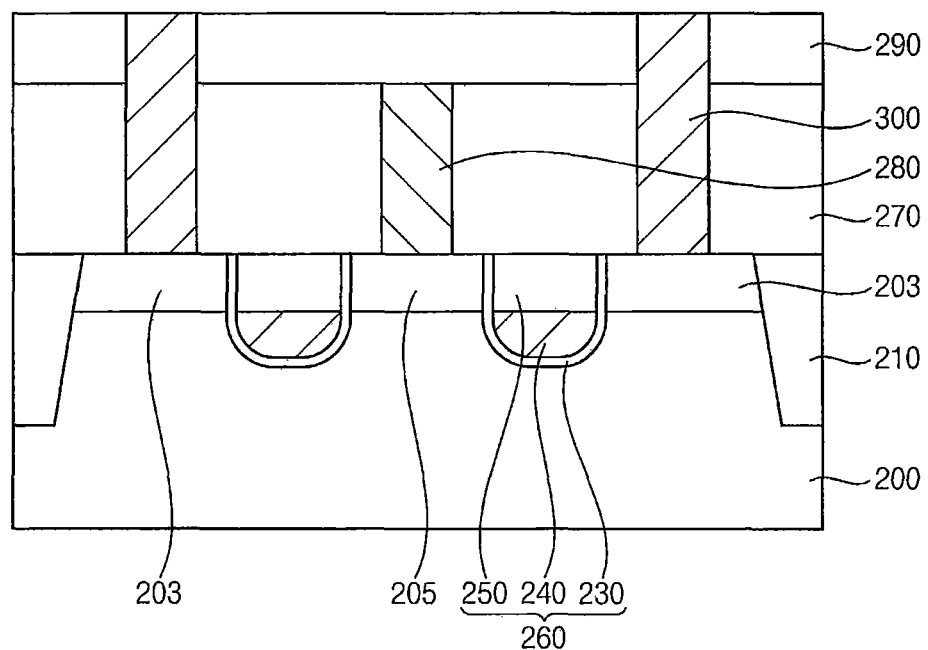

Referring to FIG. 30, a first insulating interlayer 270 may be formed on the gate structure 260, the substrate 200 and the isolation layer 210, and a source line 280 may be formed through the first insulating interlayer 270 to contact the second impurity region 205.

The first insulating interlayer 270 may be formed of an oxide, e.g., silicon oxide.

The source line 280 may be formed of a metal, e.g., tungsten, titanium, and/or tantalum, among others, a metal nitride, e.g., titanium nitride, and/or tantalum nitride, among others, and/or doped polysilicon.

The source line 280 may extend in the first direction, and a plurality of source lines 280 may be formed in the second direction. In some embodiments, each of the source lines 280 may be formed on portions of the substrate 200 and the isolation layer 210 between neighboring ones of the gate structures 260.

A second insulating interlayer 290 may be formed on the first insulating interlayer 270 and the source line 280, and a contact plug 300 may be formed through the first and second insulating interlayers 270 and 290 to contact the first impurity region 203.

The second insulating interlayer 290 may be formed of an oxide, e.g., silicon oxide.

The contact plug 300 may be formed of a metal, e.g., tungsten, titanium, and/or tantalum, among others, a metal nitride, e.g., tungsten nitride, titanium nitride, and/or tantalum nitride, among others, and/or doped polysilicon.

A plurality of contact plugs 300 may be formed in both of the first and second directions. In some embodiments, two contact plugs 300 may be formed to contact two first impurity regions 203, respectively, in each active region.

Figure 31:
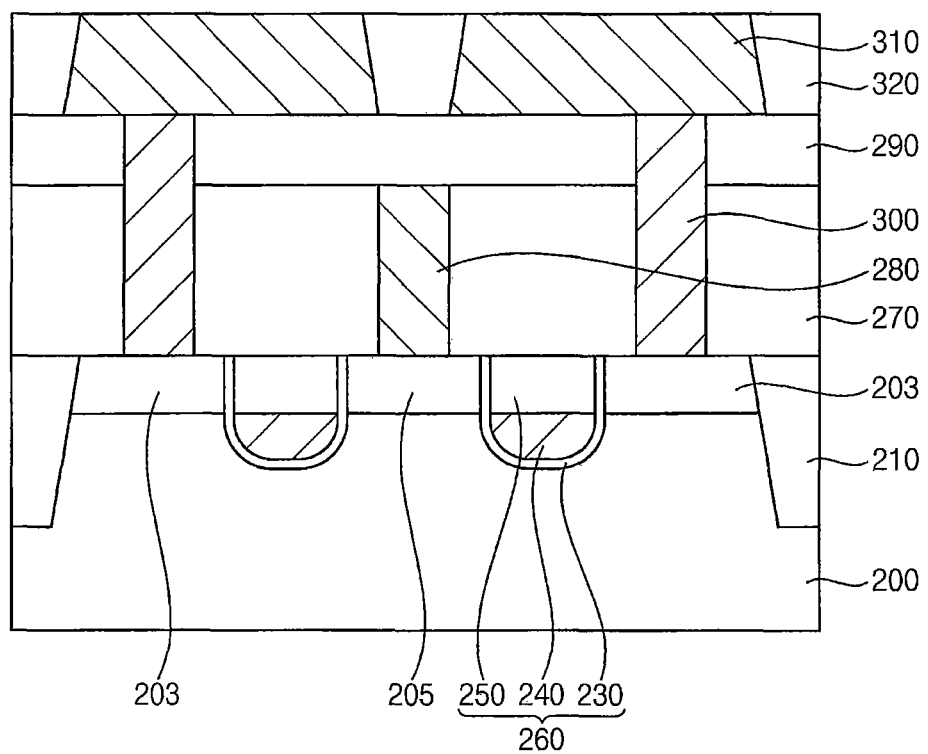

Referring to FIG. 31, a conductive pad layer may be formed on the second insulating interlayer 290 and the contact plug 300, and may be patterned to form conductive pads 310. An insulation layer 320 may be formed to fill spaces between the conductive pads 310.

The conductive pad layer may be formed of a metal, e.g., tungsten, titanium, and/or tantalum, among others, and/or a metal nitride, e.g., tungsten nitride, titanium nitride, and/or tantalum nitride, among others, and the insulation layer 320 may be formed of a nitride, e.g., silicon nitride.

In some embodiments, the conductive pads 210 may be formed to contact upper surfaces of the contact plugs 300, respectively.

Figure 32:
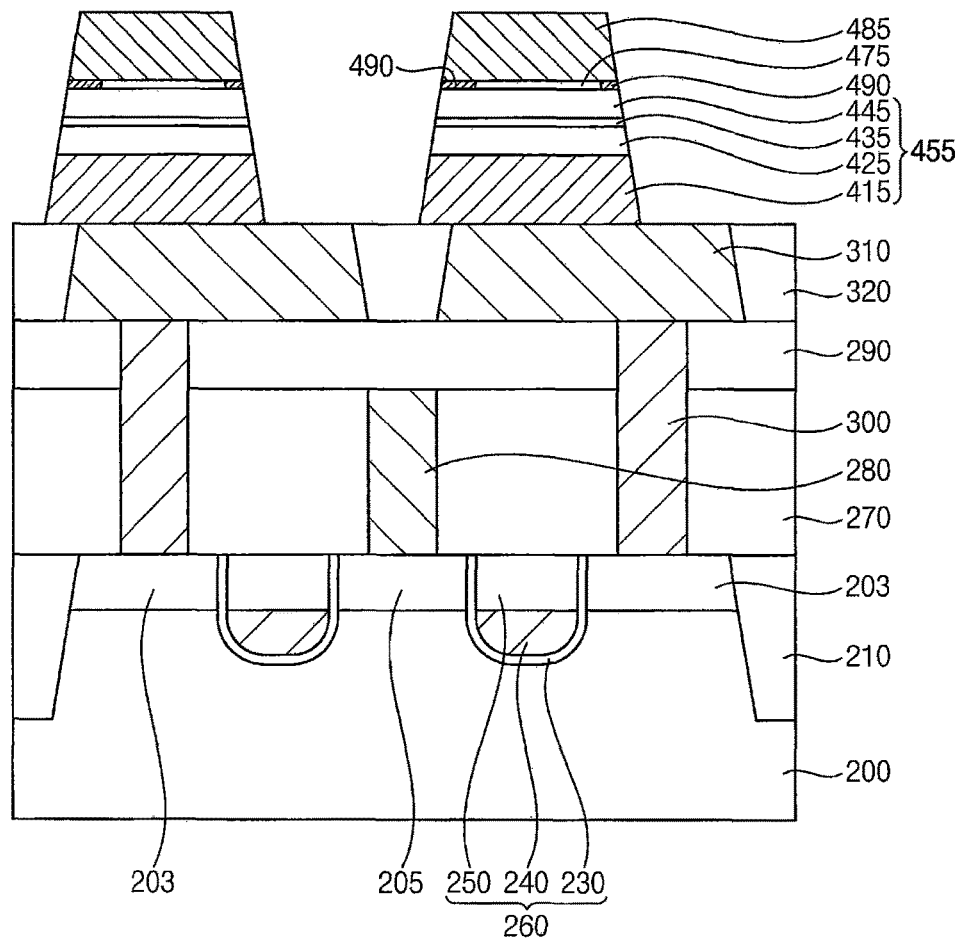

Referring to FIG. 32, process substantially the same as or similar to that illustrated with reference to FIGS. 9 to 12 and FIGS. 1 to 3 may be performed.

Thus, a memory unit including a lower electrode 415, an MTJ structure 455, a metal oxide pattern 475 and an upper electrode 485 sequentially stacked may be formed each conductive pad 310 and the insulation layer 320. A conductive pattern 490 may be formed on at least a portion of a sidewall of the metal oxide pattern 475.

In some embodiments, the MTJ structure 455 may include a fixed pattern structure 425, a tunnel barrier pattern 435 and a free layer pattern 445.

Referring to FIG. 27 again, a third insulating interlayer 500 may be formed on the conductive pads 310 and the insulation layer 320 to cover the memory unit. An opening (not shown) may be formed to expose the upper electrode 485, and a wiring 530 may be formed on the exposed upper electrode 485 to fill the opening.

The wiring 530 may include a metal pattern 520 and a barrier pattern 510 covering a bottom and a sidewall of the metal pattern 520. A plurality of wirings 530 may be formed in the first direction, and each wiring 530 may serve as a bit line of the MRAM device.

The foregoing is illustrative of some embodiments and is not to be construed as limiting thereof. Although a few some embodiments have been described, those skilled in the art will readily appreciate that many modifications are possible in some embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An MRAM device, comprising:
    a lower electrode on a substrate;
    an MTJ structure on the lower electrode;
    a metal oxide pattern directly on an uppermost surface of the MTJ structure relative to the substrate;
    a conductive pattern on at least a portion of an exterior sidewall of the metal oxide pattern, the conductive pattern having a thickness varying along the exterior sidewall of the metal oxide pattern in a plan view; and
    an upper electrode on uppermost surfaces of the metal oxide pattern and the conductive pattern relative to the substrate.

2. The MRAM device of claim 1, wherein the conductive pattern includes a metal that is included in the metal oxide pattern.

3. The MRAM device of claim 2, wherein the conductive pattern includes a heavy metal.

4. The MRAM device of claim 2, wherein the conductive pattern further includes a conductive material that is included in the upper electrode.

5. The MRAM device of claim 1, wherein the metal oxide pattern includes an oxide of a heavy metal.

6. The MRAM device of claim 1, wherein the metal oxide pattern has a periphery of a circle or an ellipse in a plan view,
    wherein the conductive pattern comprises an interior surface adjacent the metal oxide pattern and an exterior surface opposite the metal oxide pattern, and
    wherein the thickness between the interior surface and the exterior surface of the conductive pattern gradually decreases from a first point of the periphery of the circle or the ellipse of the metal oxide pattern toward a second point of the periphery of the circle or the ellipse opposite to the first point with respect to a center of the circle or the ellipse.

7. The MRAM device of claim 1, further comprising a metal pattern between the MTJ structure and the metal oxide pattern.

8. The MRAM device of claim 7, wherein the metal pattern includes a material having a high spin orbit coupling.

9. The MRAM device of claim 7, wherein the metal pattern includes a metal that is substantially the same as that of the metal oxide pattern.

10. The MRAM device of claim 8, wherein the metal pattern includes a heavy metal.

11. The MRAM device of claim 1,
    wherein the metal oxide pattern has a shape of a solid circular cylinder or a solid elliptical cylinder, and
    wherein the conductive pattern has a shape of a hollow circular cylinder or a hollow elliptical cylinder at least partially surrounding the solid circular cylinder or the solid elliptical cylinder of the metal oxide pattern.

12. The MRAM device of claim 1, wherein a center of the conductive pattern is offset from a center of the metal oxide pattern.

13. The MRAM device of claim 1, wherein the conductive pattern extends onto at least a portion of a sidewall of the upper electrode.

14. An MRAM device, comprising:
    a lower electrode on a substrate;
    an MTJ structure including:
        a fixed pattern structure on the lower electrode, the fixed pattern structure having a perpendicular magnetization direction relative to an upper surface thereof;
        a tunnel barrier pattern on the fixed pattern structure; and
        a free layer pattern on the tunnel barrier pattern, the free layer pattern having a perpendicular magnetization direction relative to an upper surface thereof;
    a metal oxide pattern directly on an uppermost surface of the MTJ structure relative to the substrate;

a conductive pattern on at least at a portion of an exterior periphery of the metal oxide pattern, the conductive pattern having a thickness asymmetrically varying along the exterior periphery of the metal oxide pattern; and an upper electrode on an uppermost surface of the metal oxide pattern relative to the substrate.

15. The MRAM device of claim 14, wherein the metal oxide pattern includes an oxide of a heavy metal.

16. The MRAM device of claim 14, wherein the metal oxide pattern has a shape of a circular cylinder or an elliptical cylinder, and the exterior periphery comprises an exterior periphery of the circular cylinder or the elliptical cylinder.

17. An MRAM device, comprising:

a lower electrode on a substrate;

an MTJ structure that includes a fixed pattern structure that is on the lower electrode and that has a perpendicular magnetization direction relative to an upper surface of the fixed pattern structure;

a metal oxide pattern directly on an uppermost surface of the MTJ structure relative to the substrate;

a conductive pattern on at least a portion of an exterior sidewall of the metal oxide pattern, the conductive pattern having a thickness varying along the exterior sidewall of the metal oxide pattern in a plan view; and an upper electrode on uppermost surfaces of the metal oxide pattern and the conductive pattern relative to the substrate.

18. The MRAM device of claim 17, wherein the metal oxide pattern has a periphery of a circle or an ellipse in a plan view, wherein the conductive pattern comprises an interior surface adjacent the metal oxide pattern and an exterior surface opposite the metal oxide pattern, and wherein the thickness between the interior surface and the exterior surface of the conductive pattern gradually decreases from a first point of the periphery of the circle or the ellipse of the metal oxide pattern toward a second point of the periphery of the circle or the ellipse opposite to the first point with respect to a center of the circle or the ellipse.

19. The MRAM device of claim 17, further comprising a metal pattern between the MTJ structure and the metal oxide pattern and that includes a material having a high spin orbit coupling.

20. The MRAM device of claim 17, wherein a vertical current flows in the conductive pattern when a vertical current is applied between the upper and lower electrodes, and wherein a horizontal current flows in the metal oxide pattern when a vertical current is applied between the upper and lower electrodes.

* * * * *